United States Patent [19]

Trimberger

[11] Patent Number: 5,610,829

[45] Date of Patent: Mar. 11, 1997

[54] METHOD FOR PROGRAMMING AN FPLD USING A LIBRARY-BASED TECHNOLOGY MAPPING ALGORITHM

[75] Inventor: Stephen M. Trimberger, San Jose, Calif.

[73] Assignee: XILINX, Inc., San Jose, Calif.

[21] Appl. No.: 647,527

[22] Filed: May 15, 1996

Related U.S. Application Data

[62] Division of Ser. No. 345,015, Nov. 23, 1994, Pat. No. 5,521,835, which is a continuation of Ser. No. 858,750, Mar. 27, 1992, abandoned.

[51] Int. Cl.$^6$ ................................................. G06F 17/50
[52] U.S. Cl. ................................. 364/489; 364/488
[58] Field of Search ................................. 364/488, 489, 364/490, 491

[56] References Cited

U.S. PATENT DOCUMENTS

| | | | |
|---|---|---|---|
| 5,210,870 | 5/1993 | Baum et al. | 395/600 |
| 5,499,192 | 3/1996 | Knapp et al. | 364/489 |

OTHER PUBLICATIONS

Xilinx Programmable Gate Array Data Book, 1991, Available From Xilinx, Inc., 2100 Logic Drive, San Jose, CA 95124.

Francis et al., "Chortle: A Technology Mapping Program for Lookup Table–Based FPGAs," 1990 27th ACM/IEEE DAC, pp. 613–619.

*Primary Examiner*—Kevin J. Teska
*Assistant Examiner*—Leigh Marie Garbowski
*Attorney, Agent, or Firm*—Edel M. Young

[57] ABSTRACT

A method for programming a programmable logic device (FPLD) to implement a circuit design using a library of elements made up of general logic functions and an invert function. The general logic functions represent groups of the $2^{2^n}$ specific logic functions which can be stored in an n-input lookup table addressing $2^n$ data signals. The specific logic functions of each group differ by one or more inverted input signals and/or an inverted output signal. The method includes the step of technology mapping the circuit design using the library of elements. The general logic functions are assigned a finite value and the invert function is assigned a zero cost (or a very small cost). A subcircuit of the circuit design having n input signals (or less) and one output will always match one logic element from this library.

3 Claims, 13 Drawing Sheets

FIG. 3b
Prior Art $$\left\{\begin{array}{ll} a*b & b*c \\ a*c & b*d \\ a*d & c*d \end{array}\right\} \qquad c*d$$

$$\left\{\begin{array}{ll} !a*b & !b*c \\ a*!b & b*!c \\ !a*c & !b*d \\ a*!c & b*!d \\ !a*d & !c*d \\ a*!d & c*!d \end{array}\right\} \qquad c*!d$$

$$\left\{\begin{array}{ll} !a*!b & !b*!c \\ !a*!c & !b*!d \\ !a*!d & !c*!d \end{array}\right\} \qquad !c*!d$$

$$\left\{\begin{array}{ll} a+b & b+c \\ a+c & b+d \\ a+d & c+d \end{array}\right\} \qquad c+d$$

$$\left\{\begin{array}{ll} !a+b & !b+c \\ a+!b & b+!c \\ !a+c & !b+d \\ a+!c & b+!d \\ !a+d & !c+d \\ a+!d & c+!d \end{array}\right\} \qquad c+!d$$

$$\left\{\begin{array}{ll} !a+!b & !b+!c \\ !a+!c & !b*!d \\ !a+!d & !c+!d \end{array}\right\} \qquad !a+!b$$

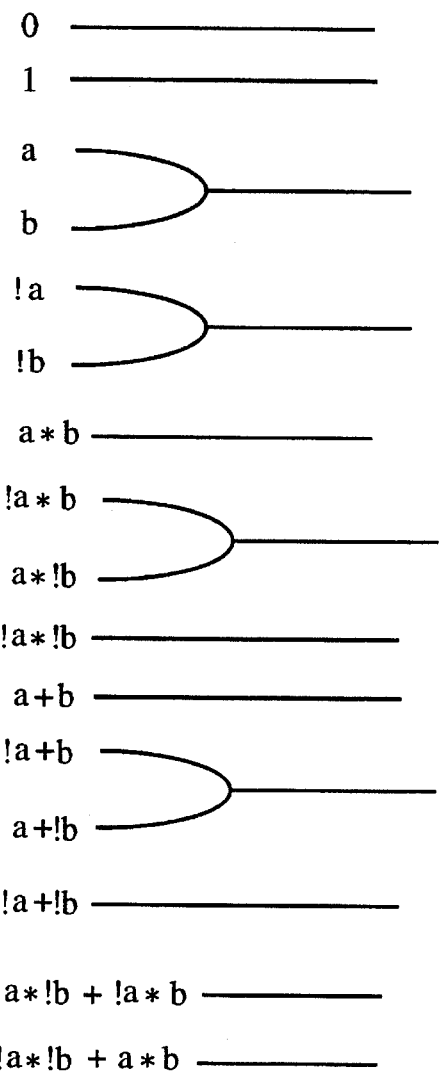
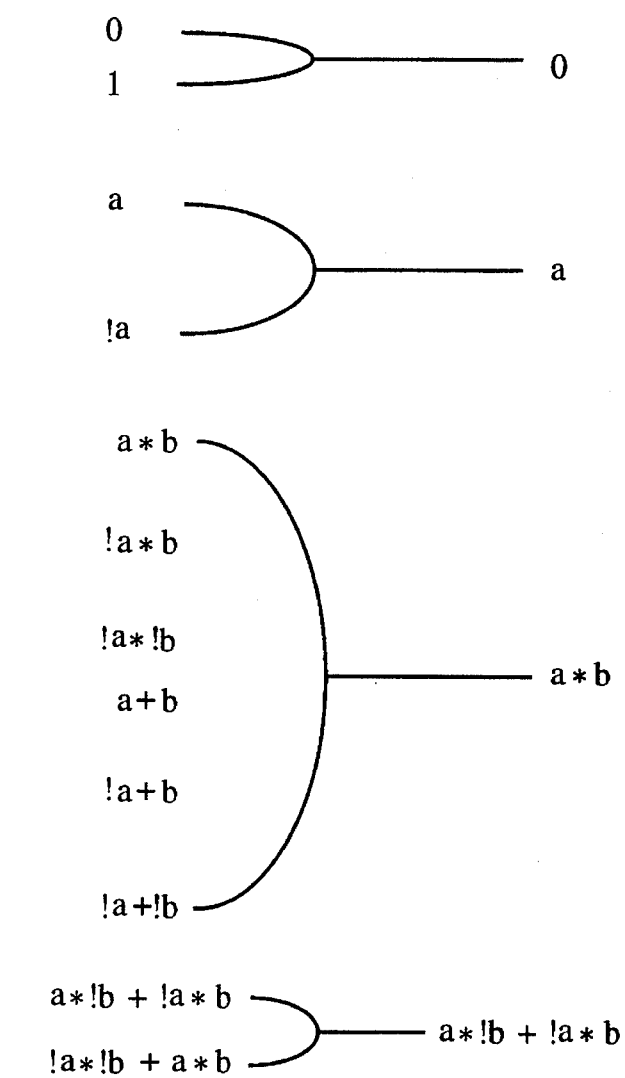
FIG. 5a
Prior Art
FIG. 5b
Prior Art
FIG. 5c
Prior Art

METHOD FOR PROGRAMMING AN FPLD USING A LIBRARY-BASED TECHNOLOGY MAPPING ALGORITHM

This application is a division of application Ser. No. 08/345,015, filed Nov. 23, 1994, now U.S. Pat. No. 5,521,835, which is a continuation of Ser. No. 07/858,750, filed Mar. 27, 1992, now abandoned.

BACKGROUND OF THE INVENTION

1. Field of the Invention

This invention relates in general to field programmable logic devices (FPLDs), and in particular to a method for programming an FPLD using a library based-technology mapping algorithm (LBTMA).

2. Description of the Prior Art

The term FPLD describes numerous types of field programmable integrated circuit (IC) devices, including programmable logic arrays and field programmable gate arrays. FPLDs are general purpose logic devices having a general circuit which incorporates programmable components disposed at predetermined circuit locations. The programmable components can be based on, for instance, fuse, antifuse, EPROM or transistor technologies. FPLDs are programmed to perform a specific function by opening, closing or enabling selected programmable components, thereby forming a subcircuit within the general circuit which provides the desired logic function. FPLDs are popular replacements for custom ICs in many circuit applications because they can be programmed to implement a circuit design much more quickly and less expensively.

Software design tools are computer programs which simplify the process of programming an FPLD to implement the logic defined by a circuit design. Software design tools execute a wide variety of tasks which typically include analysis and minimization of circuit designs, determining if a circuit design can be implemented by a target FPLD, partitioning a circuit design into logic functions which can be implemented by a target FPLD, selecting which circuit design logic function is implemented by which FPLD logic function, determining connections of FPLD interconnect resources necessary to implement the circuit design logic, providing performance information and generating a set of commands for automatic configuration of FPLDs using a device programmer. A circuit design may be first converted into a computer-readable form using a hardware description language, or using a schematic capture program. Typical software design tools then perform a "logic optimization" process which includes minimizing the number of logic elements necessary to provide the logic functions defined by the circuit design. Next, typical software design tools perform "technology mapping" in which logic of the circuit design is divided into component logic functions. These component logic functions are then compared to and matched with logic functions implemented by a target FPLD. Because the different FPLDs can implement different logic functions, technology mapping of a circuit design must be performed for each target FPLD. After technology mapping is complete, placement and routing are performed and a bit stream is typically generated which represents the programmed states of all of the programmable components of the target FPLD.

As the number of FPLD manufacturers has increased, the circuit designers' choice of FPLDs has also increased. Because a FPLD's price typically increases with the size of the FPLD, it is cost effective for a circuit designer to spend time determining the lowest priced FPLD which can implement a particular circuit design and meet performance requirements. However, the hardware description languages and software design tools of different FPLD manufacturers are typically incompatible. Therefore, to identify the most cost-efficient FPLD for implementing a particular circuit design using FPLD manufacturers' software design tools, circuit designers are required to obtain several software design tools and hardware description languages, convert the circuit design into each of the hardware description languages, execute the software design tools, and then compare the results.

The problems caused by the existence of several incompatible software design tools was solved in part by the emergence of third-party software design tool vendors. Third-party vendors provide universal design tools which can be used to perform technology mapping for a circuit design into FPLDs produced by several FPLD manufacturers, not just one. Universal tools are popular with circuit designers because they provide a convenient and time efficient method of determining the most cost-efficient FPLD for implementing a circuit design.

To sell FPLDs to circuit designers who use the services of third-party tool vendors, it is in the best interest of FPLD manufacturers to provide the third-party vendors with information regarding their FPLDs which is in a form usable by the third-party tool vendor's universal tool.

The first universal tools developed by third-party tool vendors were developed for the precursor to FPLDs, namely gate arrays and standard-cell systems. One type of software design tool developed by third-party tool vendors for gate arrays and standard cells which is now also used to program FPLDs is known as a library-based technology mapping algorithm (LBTMA). LBTMAs compare a circuit design to FPLD information stored as a library of elements, each element representing one logic function which can be implemented by a FPLD. During technology mapping, LBTMAs partition the logic of a circuit design into logic portions which are compared with the library elements until a match is found, and the matching library element is assigned to the logic portion. The library elements may have different costs. A library element that requires many FPLD resources may have a higher cost than one that requires few resources. The LBTMA attempts to find a set of library elements that implement the functions of the circuit design with the least total cost.

One third-party tool vendor using this type of software design tool is Synopsys of Mountain View, Calif. Other LBTMAs are described in a paper by Hans-Jorg Mathony and Utz G. Baitinger entitled "CARLOS: An Automated Multilevel Logic Design System for CMOS Semi-Custom Integrated Circuits" published in IEEE Transactions on Computer-Aided Design, Vol. 7, No. 3, March 1988 at pages 346–355, and a paper by Kurt Keutzer of AT&T Bell Laboratories entitled "DAGON: Technology Binding and Local Optimization by DAG Matching" in the conference papers of the 24th ADM/IEEE Design Automation Conference, 1987 at pages 341–347.

LBTMAs are particularly well suited to gate arrays, standard cells, and certain FPLDs because manufacturers of these devices previously defined efficient implementations of specific logic functions. The number of gates which can be implemented by a field programmable device is typically on the order of several thousand, while mask programmed gate array devices typically implement 100,000 gates. The time and memory required for an LBTMA to map a circuit design into a target device such as a gate array is typically dependent upon the number of elements in the library used to program the target device. That is, for any given circuit design, the time required to perform technology mapping of the circuit design using a library of 500 elements is typically longer and takes more computer memory than to map the circuit design using a library of 200 elements.

One FPLD is a field programmable gate array (FPGA). An FPGA is typically organized as shown in FIG. 1. FPGAs are generally characterized in that they consist of a matrix of configurable logic blocks (CLBs) 11 surrounded by input/output blocks (IOBs) 12. In FIG. 1 lines 13 drawn between the rows and columns of CLBs are provided for showing a network of interconnect resources which can be configured to provide desired connections between two or more CLBs and between CLBs and IOBs. In an actual layout, these interconnect resources are not necessarily disposed between the CLBs and IOBs.

CLBs are groups of configurable logic elements connected to the interconnect resources through input lines and control lines. The configurable logic of typical CLBs includes one or more 2-, 3-, or 4-input lookup table based-function generators. An example of a CLB produced by Xilinx, Inc., of San Jose, Calif., under the series number XC4000 is shown in FIG. 2a. The CLB 11 of FIG. 2a contains F, G and H programmable function generators 21, two flip-flops 22, and an internal control section 23. There are eight logic signal inputs 24, a common clock input 25, and four control inputs 26. Logic functions of two, three, four or five inputs are generated by the F, G and H function generators 21. Data input for either flip-flop 22 within the CLB is supplied from the outputs of the lookup tables associated with function generators 21, or the control inputs 26.

Function generators typically include n input lines which are used to address $2^n$ single-bit memory locations (a "lookup table"). When a combination of input signals are applied to the input lines, the contents (high or low signal) of the single memory location addressed by the input signals is applied to an output line. The $2^n$ memory locations of the lookup table are programmed to provide output signals representing a desired Boolean function. Because all $2^n$ outputs are stored in the lookup table, functions generators can implement any of $2^{2^n}$ Boolean functions of n inputs.

An example of a function generator 21 is disclosed in U.S. Pat. No. 5,343,406 and in "The Programmable Gate Array Data Book", published in 1991 by Xilinx, Inc., herein incorporated by reference. FIG. 2b illustrates an equivalent circuit of the function generator 21 disclosed in these references. The equivalent circuit includes a multiplexer (MUX) tree 201 made up of MUXs 1 to 15, input signals a–d connected to the select inputs of MUXs 1 to 15, and a lookup table made up of memory locations M1 to M16 connected to the data inputs of MUXs 1 to 8. Memory location M1 is connected to the upper data input of MUX 1 and M2 is applied to the lower data input of MUX 1. When input signal "a" is "0" or low, MUX 1 connects the logic state of memory location M1 to output line OL1. Similarly, when input signal "a" is "1" or high, MUX 1 connects the logic state of memory location M2 to output line OL1. Memory locations M3–M16 are similarly connected to MUXs 2 to 8 such that odd-numbered memory locations M3, M5, . . . M15 are applied to output lines OL2–OL8 when input signal "a" is low, and even-numbered memory locations M4, M6 . . . M16 are applied to output lines OL2–OL8 when input signal "a" is high. As illustrated, output line OL1 is applied to the upper data input of MUX 9. Similarly, output line OL2 from MUX 2 is applied to the lower data input of MUX 9. Therefore, when input signal "b" is low, the signal on output line OL1 is connected to output line OL9. The remainder of the MUX tree functions in a similar manner.

Each of the 16 memory locations M1–M16 can be programmed to connect a "0" (low) logic state or a "1" (high) logic state to the MUXs 1 to 8. One of ordinary skill in the art would recognize that the 16 memory locations can be programmed in $2^{16}$ patterns of "1s" and "0s", representing $2^{16}$ logic functions of the four input signals a–d. However, as described in U.S. Pat. No. 5,343,406, the logic states of memory locations M1–M16 can be changed after an initial configuration process. This allows some functions of more than four input signals to be implemented by the "4-input" function generator illustrated in FIG. 2b. For example, by programming memory location M1 to represent the logic state of a fifth input signal "e", as shown in FIG. 2c, the "4-input" lookup table of FIG. 2b can implement some 5-input logic functions. Moreover, the lookup table of FIG. 2b can be redrawn as shown in FIG. 2d, wherein each of the input signals IN1–IN16 can represent either dedicated logic states (such as the memory locations of a lookup table) or variable logic states (such as additional input signals).

It should be noted that the use of a memory location to provide additional input signals does not create a lookup table implementing $2^{2^{n+m}}$ logic functions, where m is the number of memory locations replaced by input signals. Instead, the number of logic functions implemented by an (n+m)-input function generator is $2^{2^n-m}$ multiplied by $3^m$. For example, FIG. 2c illustrates a 5-input function generator where the fifth input "e" replaces memory location M1. In this example n=4, m=1, and the number of implemented logic functions is $2^{(16-1)} \times 3^1$, or $3 \times 2^{15}$ (98,304). It is clear that the number of 5-input logic functions implemented by the structure of FIG. 2c is far less than the $2^{32}$ logic functions implemented by a 5-input lookup table-based function generator addressing 32 memory locations. As a further example, if 16 input signals are applied to IN1–IN16 of FIG. 2d, in addition to the four input signals a–d, then the number of 20-input logic functions implemented would be $2^0 * 3^{16}$, or $3^{16}$. One of ordinary skill in the art would recognize that this (n+m)-input structure would implement logic functions which are a subset of the $2^{2^{n+m}}$ logic functions implemented by an n-input function generator addressing $2^n$ memory locations.

It should also be noted that additional input signals can be incorporated into the MUX tree of FIG. 2d by connecting one or more additional logic gates to any of the input signals a–d. In particular, if an AND gate is connected to receive input signals "a" and "a'", logic states "1" applied to both input signals "a'" and "a" would cause a "high" signal to be applied to MUXs 1 to 8. Many such combinations of fixed logic and programmable logic are possible.

As shown in FIG. 2e, one of ordinary skill in the art recognizes that the 4-input MUX tree 201 shown in FIGS. 2b–2d can be implemented by, for example, five 2-input MUX trees 211, 213, 215, 217 and 219, as shown in FIG. 2e, each MUX tree including three MUXs which address four data signals. Further, it is also recognized by one of ordinary skill in the art that adding logic gates to the inputs of each 2-input MUX tree, as shown in FIG. 2e, is another way to combine fixed and programmable logic.

FIG. 2f illustrates a second FPLD structure which is equivalent to the function generator structure described above. That is, the structure in FIG. 2f generates output signals which are equivalent to those output by a lookup table based-function generator. In FIG. 2f, four input signals a–d are applied to input lines a–d. AND gates 1 to 8 are connected to the input lines via programmable elements 220. The outputs of AND gates 1 to 8 are applied to OR gate 221. AND gates 1 to 8 are programmed by selecting which of programmable elements 220 is connected to its respective input signal a–d. The AND gates 1–8 generate a "1" or high signal when a predetermined "address", or input signal combination, is applied to the input signals a–d. For instance, AND gate 1 can be programmed to respond to the input signal combination "0010"; that is, input signals "a", "b" and "d" are low, and input signal "c" is high. When this input signal combination is present, AND gate 1 outputs a high signal, which is passed through OR gate 221 to an output line. The AND gates can be thought of as one or more "memory locations" of a lookup table, each AND gate "storing" one or more logic states of "1", or high. More that one "memory location" can be implemented by one AND gate because fewer than n address signals can be connected to address the AND gate. That is, if n is four and an AND gate is programmed to respond to the input signal combination "001" (input signals "a" and "b" are low, input signal "c" is high), the AND gate will output a high signal for both input signal combinations "0010" and "0011" because the AND gate is addressed whether input signal "d" is high or low. Further, addresses for which a "0" or low logic state is to be output are not programmed to be recognized by any AND gate. Therefore, although the circuit structure of FIG. 2f appears very different from the MUX tree structure of FIGS. 2b–2e, the resulting logic is equivalent to a lookup table based-function generator. The n input signals of this structure address $2^n$ "memory locations". Note that if a logic pattern contains more than eight high signals, the inverse of the logic pattern is generated and the output is inverted, as depicted by phantom invert function 222. Thus the AND gate array can be made up of $2^n/2$ or less AND gates (representing high logic states). In FIG. 2f, the combination of eight or less high logic states combine to represent the high output signals which will be provided in response to the certain addresses sent by the four input signals. Therefore, just as the lookup table based-function generator discussed above, this circuit structure implements all $2^{16}$ possible functions of four inputs using the eight AND gates 1 to 8, the structure of FIG. 2f also implements all $2^{16}$ possible functions of four inputs.

Unlike the MUX tree structure described above, the addresses of the AND gates are programmable. As with the MUX tree of FIGS. 2b–2e, the circuit structure of FIG. 2f can be constructed for any number n of input signals wherein fewer than $2^n/2$ AND gates are used. Note that if fewer than $2^n/2$ AND gates have been provided for an n-input signal structure, then the number of input functions implemented by the n inputs will be less than $2^{2^n}$ logic functions.

One of ordinary skill in the art will recognize that there are other circuit structures which, like the structure of FIG. 2f, are equivalent to the lookup table based-function generator of FIGS. 2b–2e. The structures described above and any other equivalent circuit structures are referred to below as "lookup table based-FPLDs." In addition, the term "lookup table" refers to the memory locations or data input signals associated with the MUX tree structures of FIGS. 2b–2e and any equivalent logic, such as the equivalent logic associated with FIG. 2f.

A problem with lookup-table based-FPLDs is that they are not efficiently programmed using LBTMA software design tools because the prior art libraries used to describe all logic functions implemented by a lookup table (or equivalent structure) were too large. This problem arises because an n-input lookup table can implement any Boolean function having n (or less) inputs by programming the associated memory locations (or data input signals) to implement the Boolean function. The $2^n$ memory locations associated with an n-input lookup table can be programmed to store up to $2^{2^n}$ memory patterns, each memory pattern representing one logic function. For example, the 16 memory cells associated with a four-input lookup table can be programmed in $2^{16}$, or 65,536, different memory patterns. In addition, two four-input lookup tables combined to form a five-input lookup table can be programmed in $2^{32}$, or 4,294,967,296 different memory patterns to represent the outputs of $2^{32}$ different five-input Boolean functions. As discussed above, the larger the number of library elements, the longer it typically takes for an LBTMA to perform technology mapping for a circuit design. Clearly, technology mapping using a library of over 4 billion elements requires an impractical amount of time. Even a library of 65,536 elements is impractical. Software design tools specifically developed to perform technology mapping of lookup table based-FPLDs operate efficiently because they do not use libraries. However, circuit designers and third-party tool vendors are typically not interested in running both LBTMAs and design tools specifically developed for lookup table based-FPLDs. In addition, they are usually not willing to pay for the impractical amount of time necessary for an LBTMA to perform technology mapping for FPLDs using libraries having tens of thousands of elements. When this happens, FPLD manufacturers having devices defined by large libraries lose potential customers.

One prior art solution to the problem associated with the excessively large number of library elements needed to define the logic functions implemented by a lookup table-based FPLD was to reduce the number of library elements by a process referred to herein as "pin swapping". Pin swapping recognizes that although a lookup table can be programmed to implement a large number of logic functions, many of those functions are duplicates which differ only in that input signals are placed differently. An example of pin swapping is shown in FIGS. 3a and 3b for a 2-input lookup table. The symbols "*" and "+" located between the two input descriptors "a" and "b" are used to indicate AND and OR operations, respectively. The symbol "!" located in front of an input descriptor indicates an invert operation. FIG. 3a lists all $2^4$, or 16, specific logic functions which can be implemented in a 2-input lookup table. The specific logic functions which differ only in that input signals are placed differently, or rearranged, are grouped as indicated and listed in FIG. 3b. That is, inputs "a" and "b" each represent a single input signal. Because a single input can be applied to either input pin "a" or pin "b", there is no need to include both specific logic functions in the library. Therefore, as indicated in FIG. 3b, the two specific logic functions "a" and "b" are grouped together and represented by the general logic function "a". Similarly, "!a" and "!b" are grouped and represented by the general logic function "!a". Specific logic functions "!a'b" and "a*!b" contain one inverted and one non-inverted input signal. It is clear that these two specific logic functions differ only in that non-inverted input signals and inverted input signals are applied to different input pins. Therefore, both specific logic functions "!a*b" and "a*!b" can be represented by the general logic function "!a*b". Similarly, "!a+b" and "a+!b" can be represented by the general logic function "!a+b". Through the process of pin swapping, it is shown that the number of general logic functions needed to represent all specific logic functions implemented by a 2-input lookup table is 12.

A second example illustrating the pin swapping process for a 4-input lookup table is shown in FIGS. 4a and 4b. The 65,536 specific logic functions implemented by a 4-input lookup table include the logic functions shown in FIG. 4a, where "a", "b", "c" and "d" represent the four input signals, "*" represents an AND operation, "+" represents an OR operation and "!" represents an invert operation. FIG. 4a includes all 4-input specific logic functions wherein only two of the four inputs and one AND or OR operation are used to generate an output. Similar to the first example, above, which regards 2-input lookup tables, the bracketed groups of specific logic functions in FIG. 4a are represented by the general logic functions shown in FIG. 4b. That is, the bracketed group of specific logic functions including a*b, a*d, etc. are represented by the function c*d. Likewise, the specific logic functions !a*b, a*!b, . . . are represented by the general logic function c*!d. Other general logic functions and their corresponding groups of specific logic functions are shown in FIGS. 4a and 4b, respectively.

When the process of grouping all specific logic functions which differ only by rearranging the inputs is performed for all of the possible Boolean functions of four inputs, the 65,536 specific logic functions are represented by 3,984 general logic functions, or library elements. However, even though a library having 3,984 elements is significantly smaller than a library having 65,536 elements, an impractical amount of time is still necessary to run an LBTMA using this library.

Another method for further reducing the number of library elements is to simply remove elements which are not considered likely to be used. This method has been used in the FPLD-programming industry with some frequency. However, this method leaves open the possibility that a 4-input logic function could not be mapped into a single 4-input lookup table, which would reduce density of logic functions per unit of silicon area, resulting in poor programming results.

SUMMARY OF THE INVENTION

The present invention provides a method for programming a lookup table-based FPLD using a unique library of elements which is substantially smaller than prior art libraries and whose elements represent some or all of the $2^{2^n}$ specific logic functions implemented by an n-input lookup table. By reducing the number of library elements, an LBTMA requires less time to perform technology mapping of a circuit design into a lookup table-based FPLD. By reducing the mapping time, LBTMAs can run more efficiently.

A method for programming an n-input lookup table-based FPLD to implement a circuit design according to the present invention uses a unique library of elements which include general logic functions and an invert function. The general logic functions represent groups of the $2^{2^n}$ specific logic functions in an n-input lookup table. The specific logic functions of each group differ by one or more inverted input signals and/or an inverted output signal. The method includes the following four steps:

(1) technology mapping a circuit design with an LBTMA where the library used by the LBTMA is the set of general logic functions plus an invert function, each general input function representing groups of specific logic functions which differ by pin swapping or by an inverted input signal (or in a second embodiment by an inverted input signal and/or output signal). Preferably, the set of general logic functions represent all $2^{2^n}$ specific logic functions implemented by an n-input lookup table. The invert function is assigned a zero cost and general logic functions are assigned a finite cost. The invert function is assigned a zero cost because an invert function can always be incorporated into a truth table defining a function by changing appropriate memory locations. That is, it is never necessary to make the truth table larger to incorporate one or more invert functions, and no FPLD resources are used other than the lookup table. The circuit design is then matched to and represented by a general logic function plus any necessary invert functions.

The LBTMA will typically add pairs of invert functions to input signals and output signals of the circuit design, one of each pair of invert functions being incorporated into and modifying the circuit design such that the modified circuit design matches one general logic functions in the library, and one of which becomes a separate logic portion represented by the invert function library element.

(2) merging the modified circuit design (which incorporates one of each pair of invert functions) with the invert functions on the input signals or output signal to determine a truth table for configuring a lookup table of the FPLD.

(3) placing and routing the truth tables and other functions (for example flip flops) into positions in the FPLD, and forming a bit stream which is used to program the truth tables and other elements of the target FPLD.

(4) loading the bit stream into the target FPLD.

BRIEF DESCRIPTION OF THE DRAWINGS

FIGS. 2b–2e are diagrams illustrating an equivalent circuit of a function generator of FIG. 2a.

FIGS. 3a and 3b are diagrams showing a first example of pin swapping.

FIGS. 4a and 4b are diagrams showing a second example of pin swapping.

FIG. 5a–5c are diagrams showing a first example of the generation of general logic functions according to the present invention.

DESCRIPTION OF THE PREFERRED EMBODIMENT

Library of Elements

Figure 1:
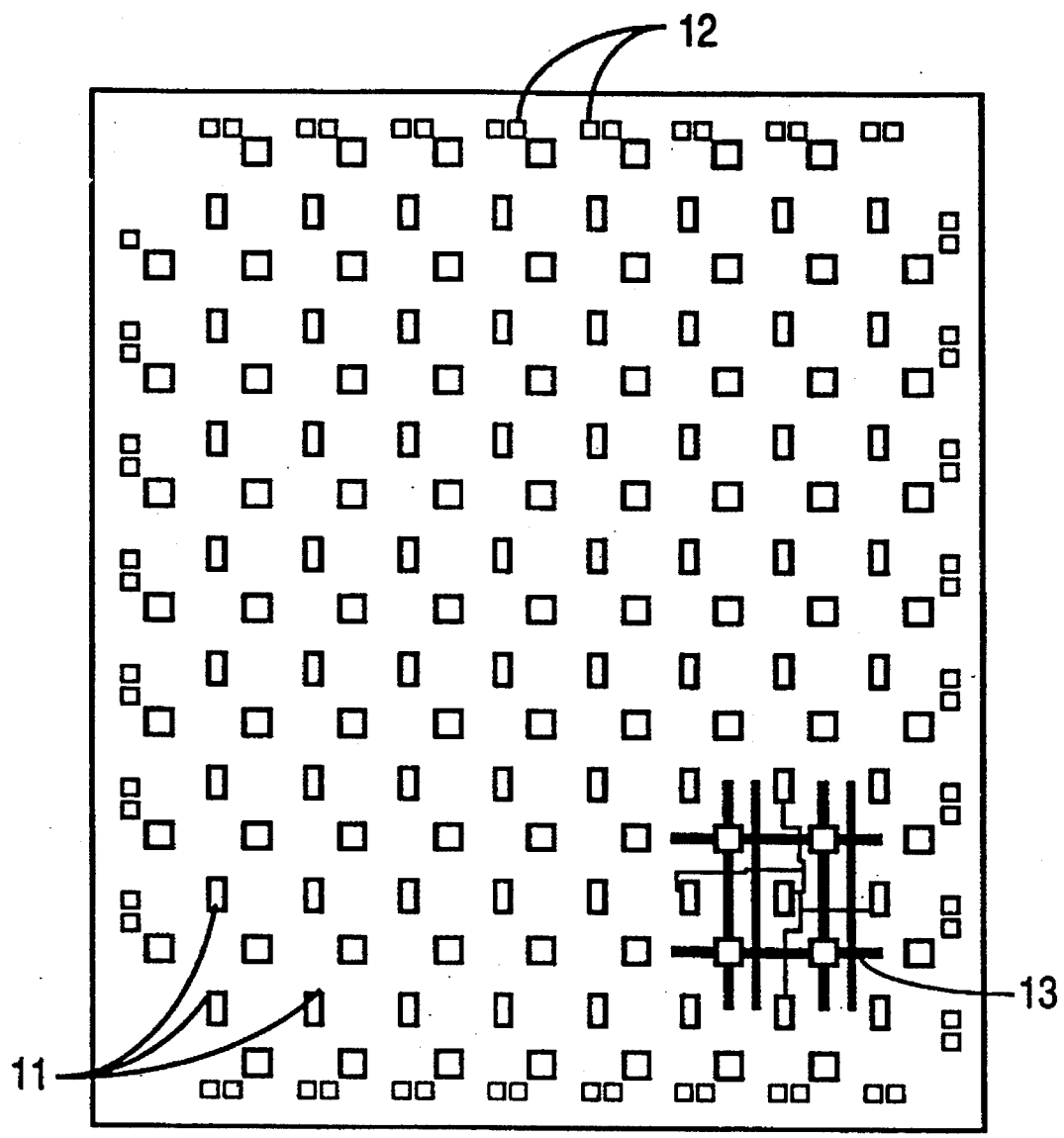
FIG. 1 is a plan view of a prior art FPGA.
Figure 2A:
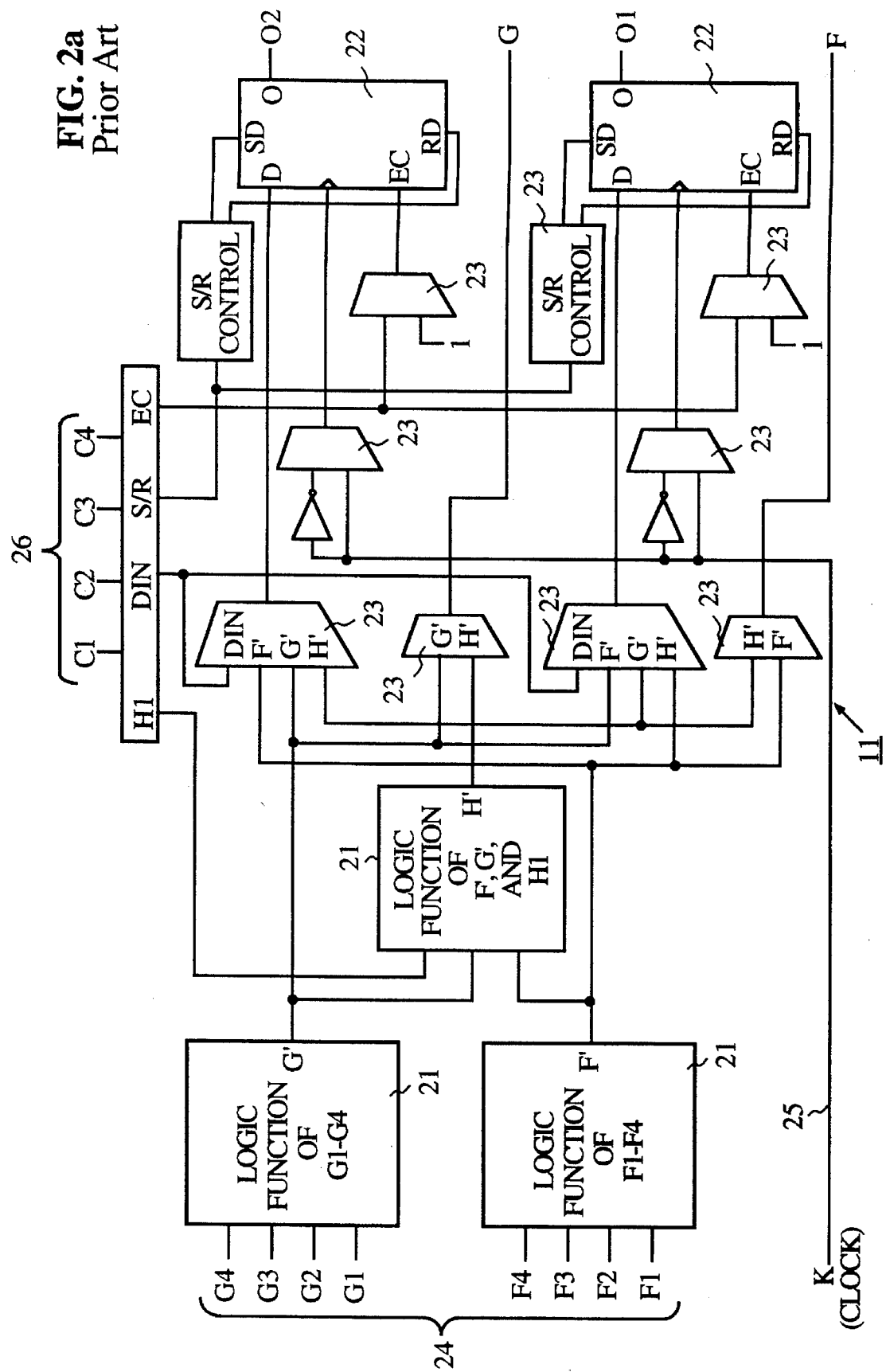
FIG. 2a is a simplified circuit diagram showing a CLB from a Xilinx XC4000-series FPGA.
Figure 2B:
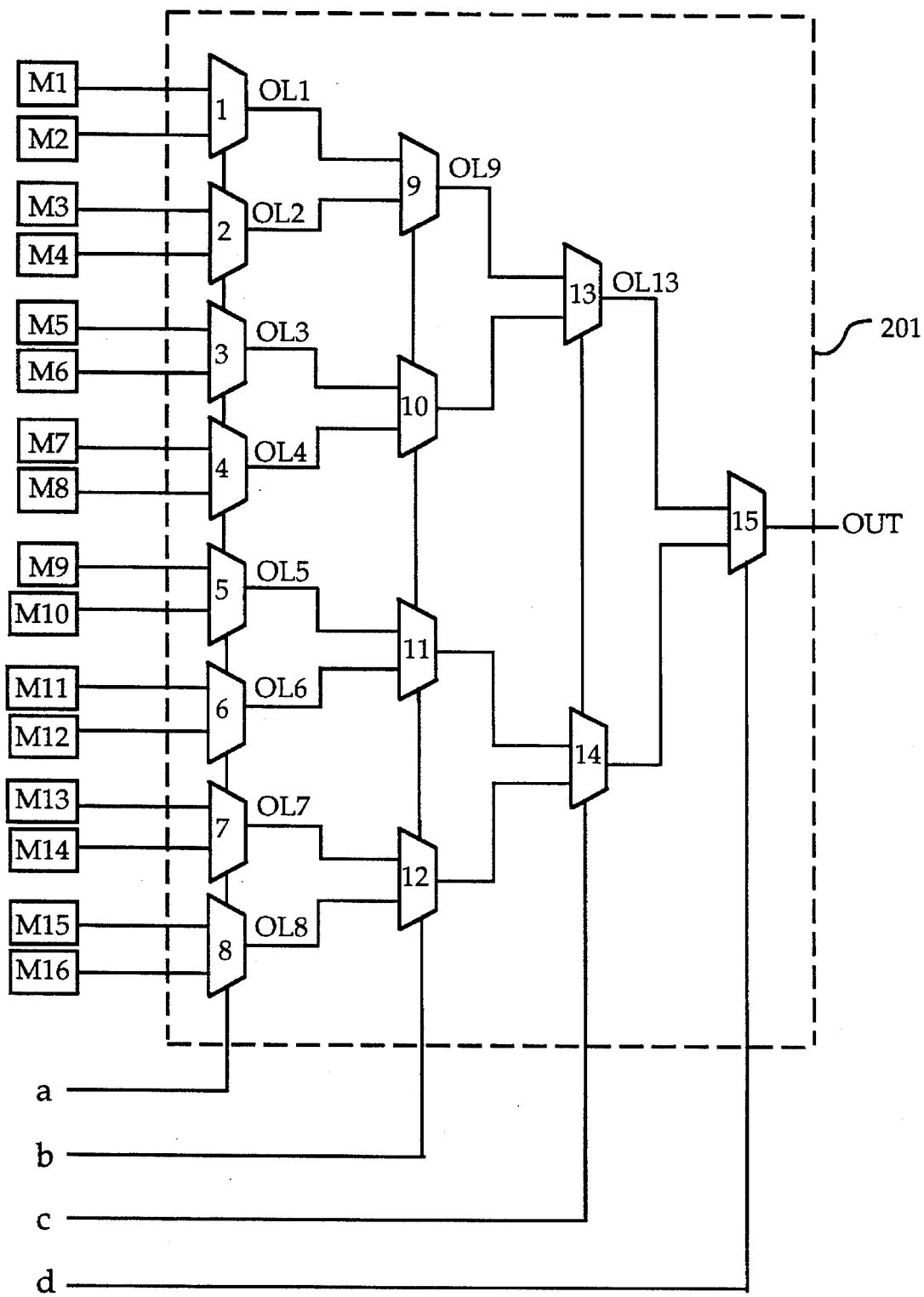
Figure 2C:
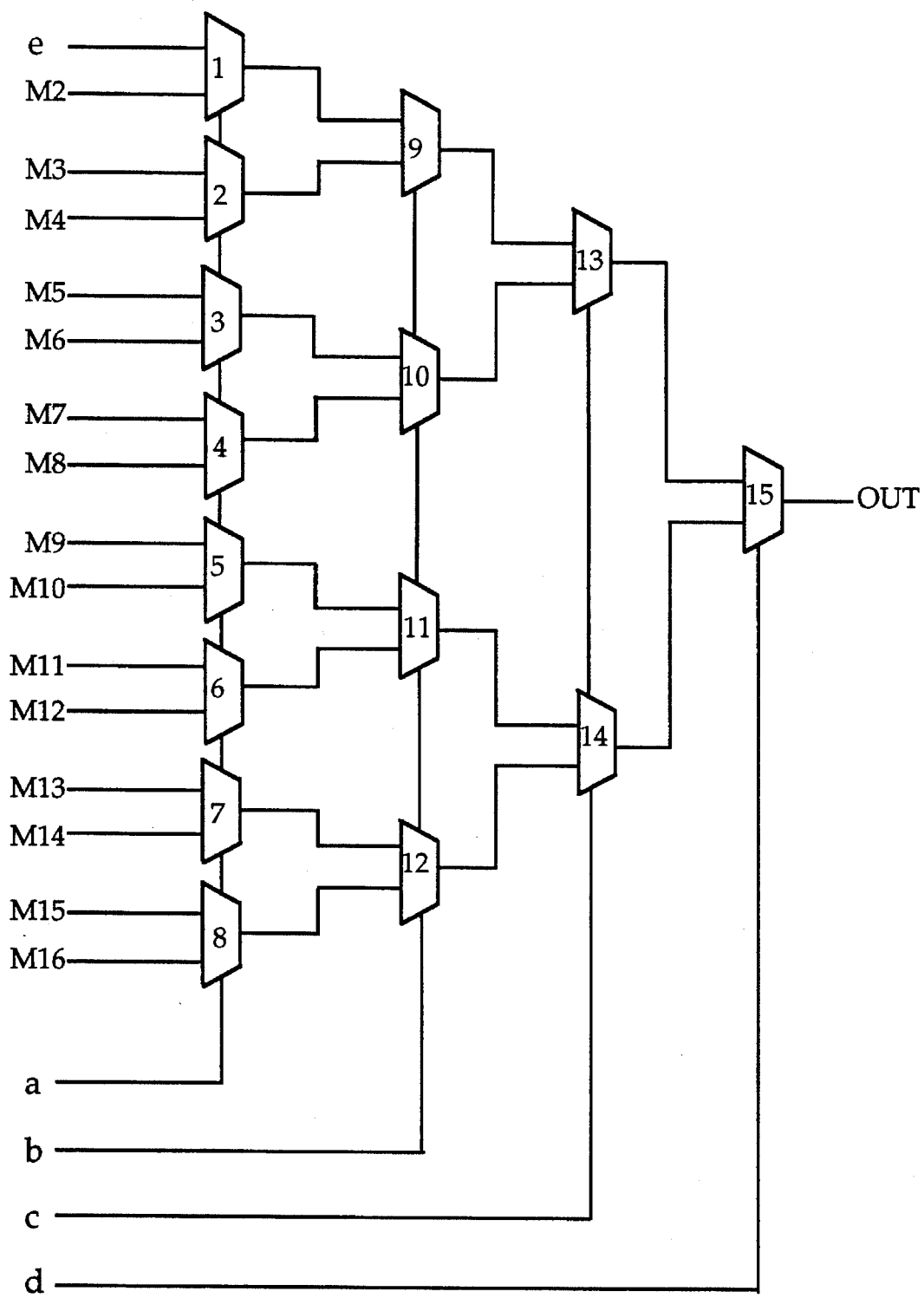
Figure 2D:
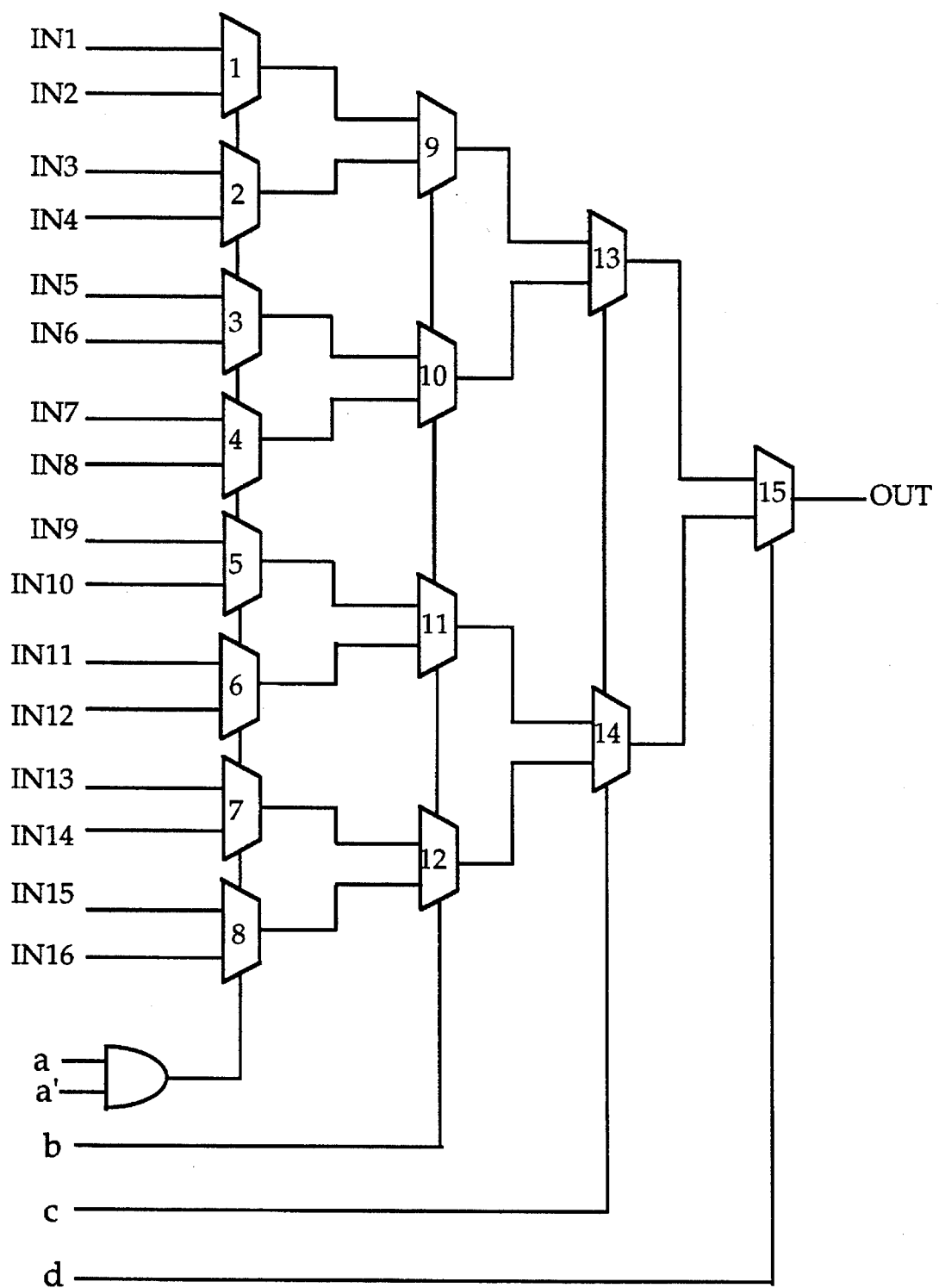
Figure 2E:
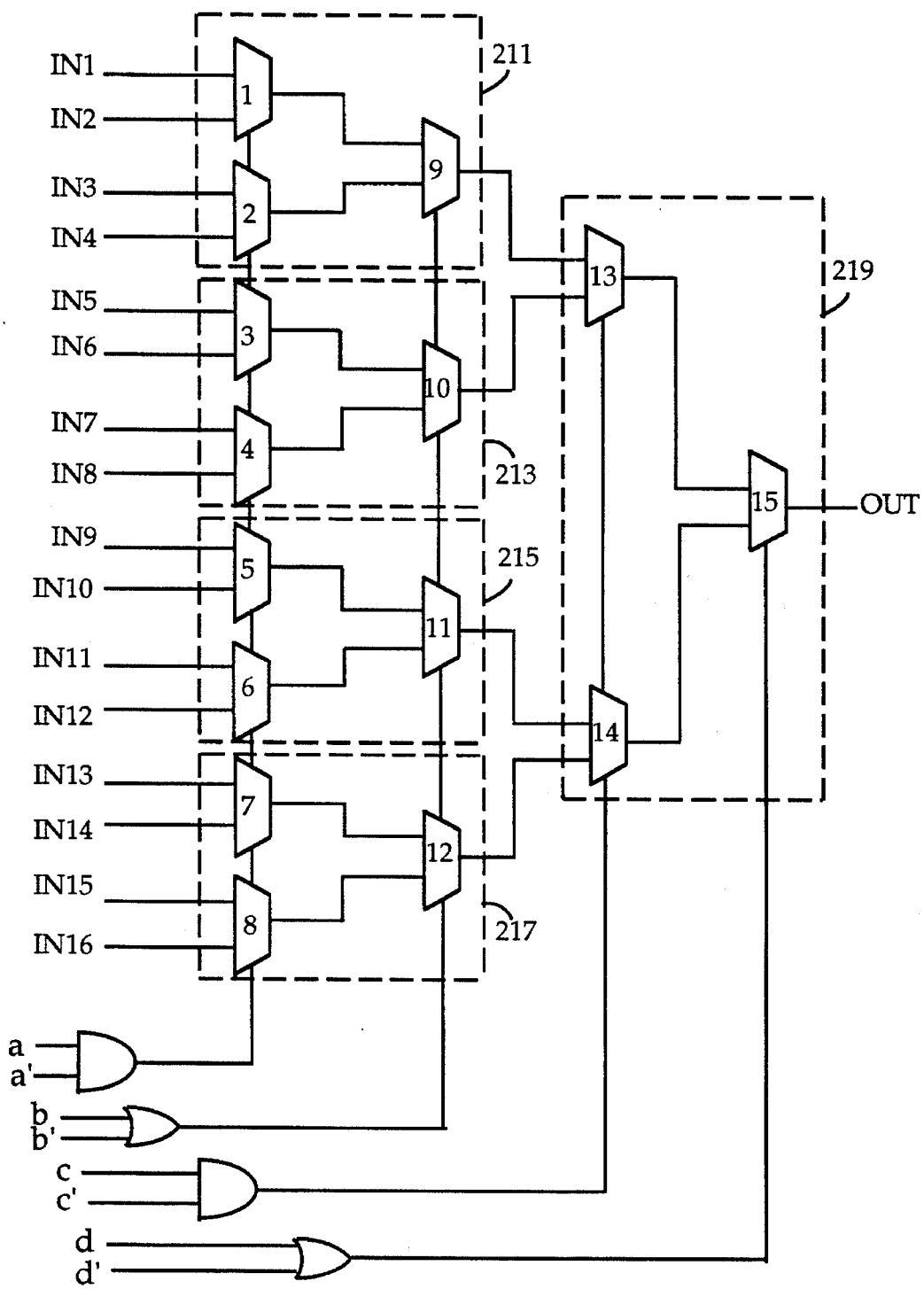
Figure 2F:
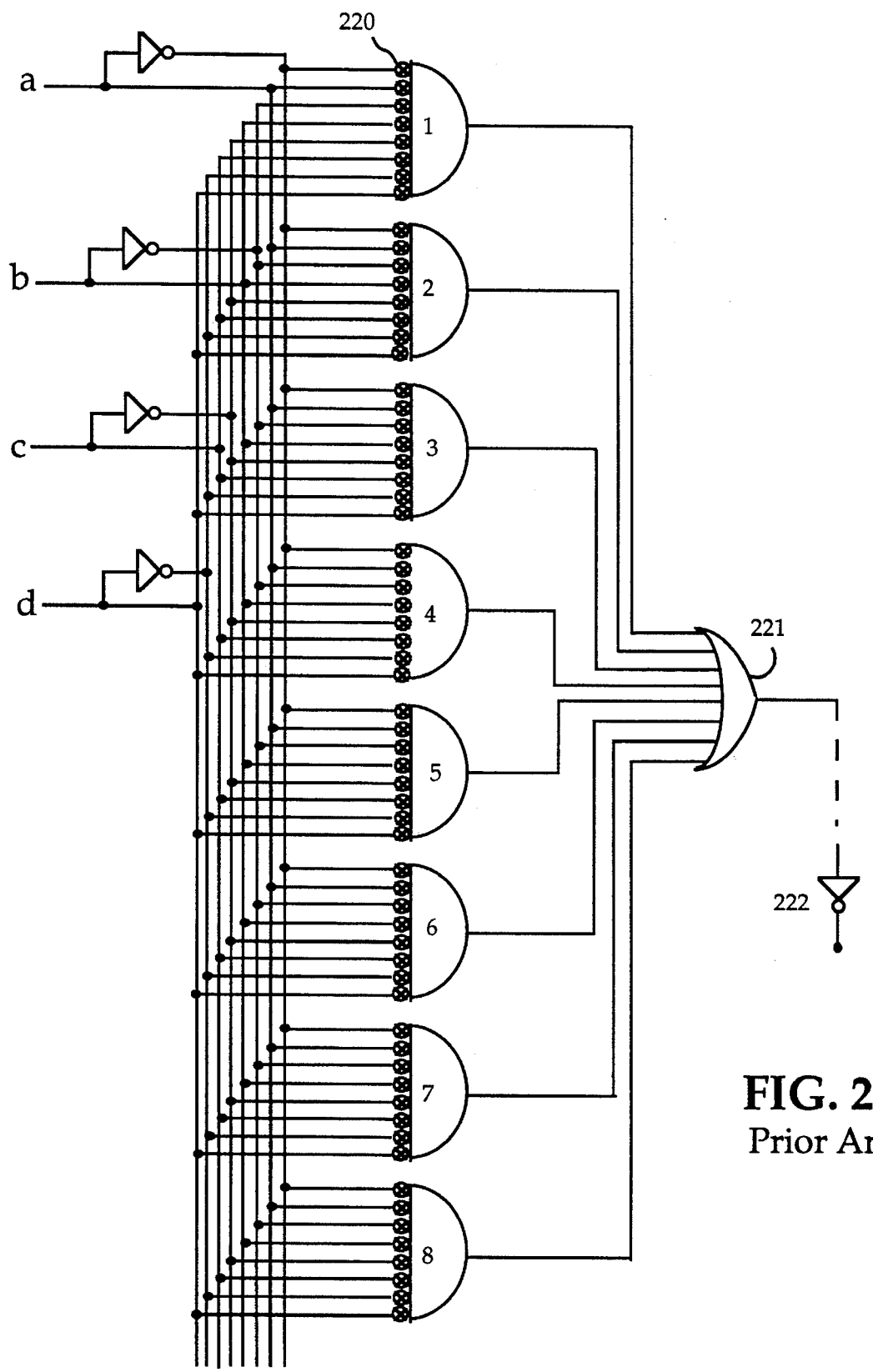
FIG. 2f is a simplified circuit diagram of a second FPLD circuit.

A method for programing a lookup table-based FPLD in accordance with the present invention uses a unique library of elements to represent the $2^{2^n}$ specific logic functions implemented by an n-input lookup table addressing $2^n$ memory locations or data input signals. The library of elements includes a plurality of general logic functions and an invert function. In accordance with the present invention, the general logic functions represent groups of the specific logic functions, the specific logic functions of each group being related in that they differ by one or more inverted input signals. In addition, the specific logic functions may differ by an inverted output signal. The number of library elements required to represent the $2^{2^n}$ specific logic functions associated with an n-input lookup table in accordance with the present invention is substantially reduced from prior art libraries. When used with an LBTMA-type software design tool, the library of elements defined in accordance with the present invention substantially reduces the time and memory required to analyze and program lookup table-based FPLDs.

A library of general logic functions defined in accordance with the present invention incorporates the pin swapping process, discussed above, but takes the process one step further. That is, pin swapping recognizes that groups of specific logic functions associated with an n-input lookup table are duplicates except for interchanged input signals. A library in accordance with the present invention is understood by recognizing that any number of inversions of input signals and/or output signals can be implemented by a lookup table simply by changing the lookup table's memory pattern. Therefore, all specific logic functions which differ by one or more inverted input signals can be represented by general logic functions as elements of a library, provided the library also includes an invert function. When combined with the prior art pin swapping method, a library having a substantially fewer number of elements can be generated to represent the $2^{2^n}$ specific logic functions implemented by an n-input lookup table.

An example of a library representing a 2-input lookup table-based FPLD in accordance with the present invention is shown in FIG. 5a–c. FIGS. 5a and 5b duplicate FIGS. 3a and 3b to illustrate how pin swapping reduces the number of specific logic functions from 16 to 12, as discussed in the background section. FIG. 5c illustrates that the 12 elements defined by pin swapping are further reduced to four in accordance with the present invention. Specifically, 0 and 1 differ in that if an invert function is applied to, for example, 0, it becomes 1, and vice versa. Therefore, in accordance with the present invention, both 0 and 1 are represented by the general logic function 0. Similarly, the four specific logic functions "a", "b", "!a" and "!b" are represented by "a". Next, a*b, !a*b, and !a*!b differ in that an invert function applied to the "a" input signal of the logic function a*b produces !a*b; an additional invert function applied to the "b" input signal produces the logic function !a*!b. Therefore, in accordance with the present invention, the general logic function a*b represents both !a*b and !a*!b. Recall that pin swapping includes a*!b in the function !a*b. One of ordinary skill in the art would further recognize that the logic function a+b can be represented by the logic function !(!a*!b). Therefore, if an invert function is applied to the output of !a*!b, it becomes clear that the general logic function a*b also represents a+b, !a+b and !a+!b. Similarly, the functions a*!b+!a*b and !a*!b+a*b can be represented by the general logic function a*!b+!a*b.

Figures 6A, 6B, 6C:
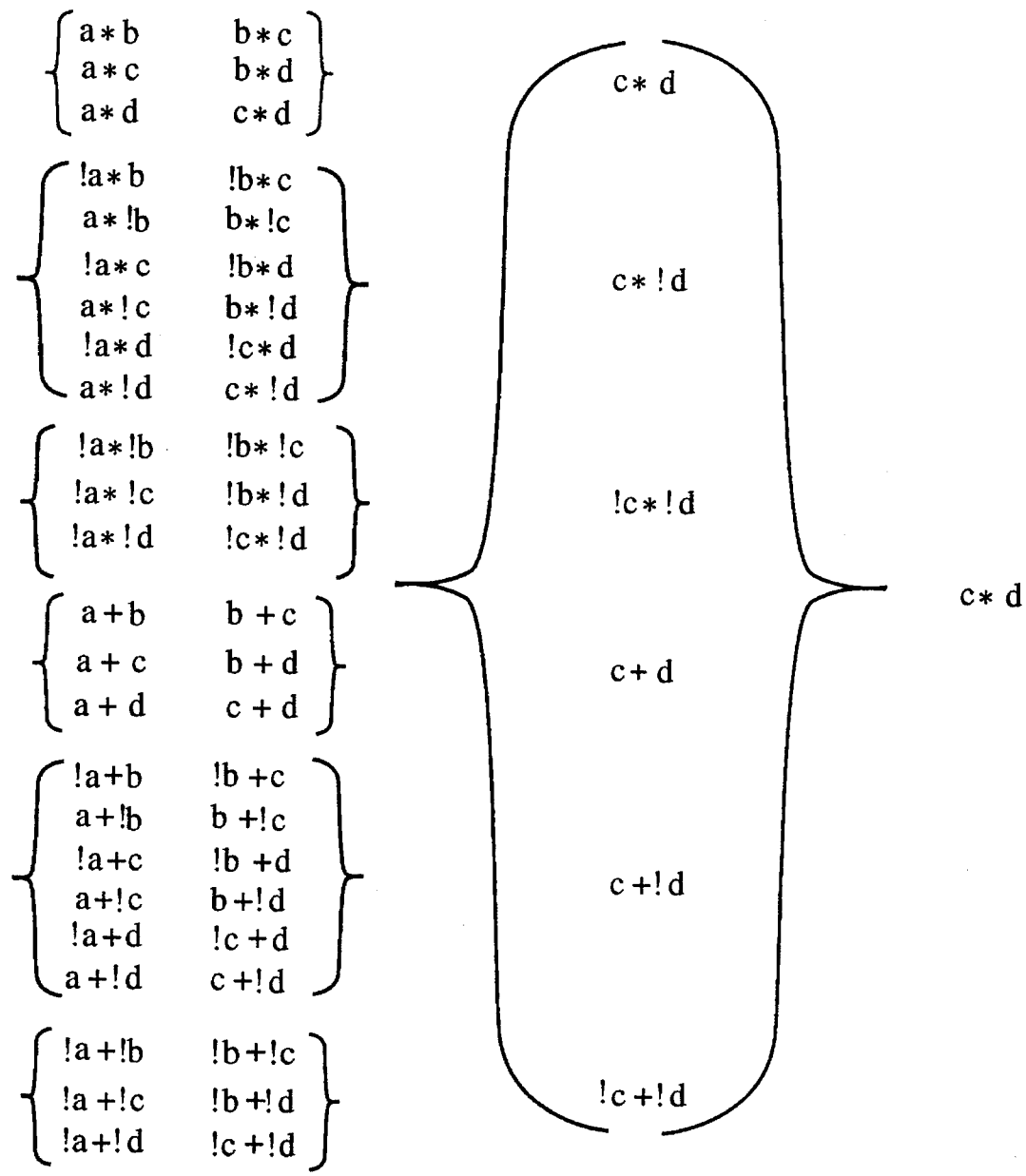
FIG. 6a–6c are diagrams showing a second example of the generation of general logic functions according to the present invention.

A second example of how a library is defined for a 4-input lookup table in accordance with the present invention is shown in FIG. 6a–6c. FIGS. 6a and 6b duplicate FIGS. 4a and 4b to illustrate how pin swapping reduces the number of 2-input functions implemented by a 4-input lookup table from 48 to six, as discussed in the background section. FIG. 6c illustrates that the six elements defined by pin swapping are further reduced to one in accordance with the present invention. This reduction is accomplished by separating out inverted inputs and outputs, as discussed above with respect to the 2-input lookup tables. Specifically, c*d, c*!d and !c*!d differ in that an invert function applied to the "d" input signal of the logic function c*d produces c*!d, and an additional invert function applied to the "c" input signal produces the logic function !c*!d. Further, as mentioned above, c+d can be represented by the logic function !(!c*!d). Therefore, all six functions listed in FIG. 6b can be represented by the general logic function c*d, shown in FIG. 6c.

It is clear from the above examples that the specific logic functions of 2-, 3- and 4-input lookup tables addressing $2^2$, $2^3$ or $2^4$ memory locations or data input signals, respectively, can be collected and represented by general logic functions. Table 1 compares the number of lookup table input signals, specific logic functions (data input or memory patterns), general logic functions defined by pin swapping, and general logic functions defined according to the present invention. Note that for 2- and 3-input lookup tables, the number of specific logic functions is

TABLE 1

| Inputs | Data Signal or Memory Patterns | Pin Swapping | Invert Method |
|---|---|---|---|
| 2 | 16 | 12 | 4 |
| 3 | 256 | 80 | 14 |
| 4 | 65,536 | 3,984 | 222 |
| 5 | 4,294,967,296 | ??? | >800,000 | relatively small and could be used as a library in an LBTMA without sacrificing a great deal of processing time and computer memory. However, note the dramatic difference between the number of general logic functions and the number of specific logic functions for 4- and 5-input lookup tables. A 4-input lookup table in accordance with the present invention can be represented by an inverter function and the 222 general logic functions. An LBTMA can map a circuit design into a 4-input lookup table-based FPLD substantially faster using the library of 223 library elements (222 general logic functions plus one invert operation) according the present invention than the 3984 elements defined using pin swapping. The general logic functions for 2-, 3- and 4-input lookup tables are listed in Tables 2, 3 and 4, respectively.

TABLE 2 x0 = 0;
x1 = a;
x2 = a*b;
x3 = a*!b + !a*b;

TABLE 3 x0 = 0;
x1 = a*b*c;
x2 = b*c;
x3 = a*!b*c + !a*b*c;
x4 = b*c + a*c;
x5 = c;
x6 = a*b*!c + a*!b*c + !a*b*c;
x7 = b*c + a*c + a*b;
x8 = a*b*!c + !a*!b*c;
x9 = !a*!b*c + a*b;
x10 = !a*c + a*b;
x11 = a*b*!c + !b*c + !a*c;
x12 = b*!c + !b*c;
x13 = a*!b*!c + !a*b*!c + !a*!b*c + a*b*c;

TABLE 4

```
x0 = 0;
x1 = a*b*c*d;
x2 = b*c*d;
x3 = a*!b*c*d + !a*b*c*d;
x4 = b*c*d + a*c*d;
x5 = c*d;
x6 = a*b*!c*d + a*!b*c*d + !a*b*c*d;
x7 = b*c*d + a*c*d + a*b*d;
x8 = a*b*!c*d + !a*!b*c*d;
x9 = !a*!b*c*d + a*b*d;
x10 = !a*c*d + a*b*d;
x11 = a*b*!c*d + !b*c*d + !a*c*d;
x12 = a*b*d + c*d;
x13 = b*!c*d + !b*c*d;
x14 = b*!c*d + !b*c*d + a*c*d;
x15 = c*d + b*d;
x16 = a*!b*!c*d + !a*b*!c*d + !a*!b*c*d + a*b*c*d;
x17 = a*!b*!c*d + b*c*d + !a*c*d + !a*b*d;
x18 = a*!b*d + !a*b*d + c*d;
x19 = a*!c*d + !b*c*d + !a*b*d;
x20 = c*d + b*d + a*d;
x21 = d;
x22 = a*b*c*!d + a*b*!c*d + !a*b*c*d + !a*b*c*d;
x23 = b*c*d + a*c*d + a*b*d + a*b*c;
x24 = a*b*c*!d + a*b*!c*d + !a*!b*c*d;
x25 = !a*!b*c*d + a*b*d + a*b*c;
x26 = a*b*c*!d + a*b*!c*d + !a*c*d;
x27 = !a*c*d + a*b*d + a*b*c;
x28 = a*b*c*!d + a*b*!c*d + !b*c*d + !a*c*d;
x29 = a*b*d + a*b*c + c*d;
x30 = a*b*c*!d + !a*b*!c*d + !b*c*d;
x31 = !a*b*!c*d + !b*c*d + a*b*c;
x32 = !a*b*d + a*b*c + c*d;
x33 = a*b*c*!d + b*!c*d + !b*c*d;
x34 = b*!c*d + !b*c*d + a*b*c;
x35 = a*b*c*!d + b*!c*d + !b*c*d + !a*c*d;
x36 = a*b*c + c*d + b*d;
x37 = a*b*c*!d + a*!b*!c*d + !a*b*!c*d + !a*!b*c*d;
x38 = a*!b*!c*d + !a*b*!c*d + !a*!b*c*d + a*b*c;
x39 = a*b*c*!d + a*!b*!c*d + !a*c*d + !a*b*d;
x40 = a*!b*!c*d + !a*c*d + !a*b*d + a*b*c;
x41 = a*b*c*!d + !b*c*d + a*b*d + !a*b*d;
x42 = a*!b*d + !a*b*d + a*b*c + c*d;
x43 = a*b*c*!d + a*!c*d + !b*c*d + !a*b*d;
x44 = a*b*c + c*d + b*d + a*d;
x45 = a*b*c*!d + !a*!b*c*!d;
x46 = !a*!b*!c*d + a*b*c;
x47 = a*b*c*!d + !a*!b*!c*d + !a*b*c*d;
x48 = !a*!b*!c*d + b*c*d + a*b*c;
x49 = a*b*c*!d + !a*!b*!c*d + a*!b*c*d + !a*b*c*d;
x50 = !a*!b*!c*d + b*c*d + a*c*d + a*b*c;
x51 = !a*!b*d + a*b*c;
x52 = b*c*d + !a*!b*d + a*b*c;
x53 = !a*!b*d + a*b*c + c*d;
x54 = a*b*c*!d + !a*!b*!c*d + a*b*!c*d + a*!b*c*d + !a*b*c*d;
x55 = !a*!b*!c*d + b*c*d + a*c*d + a*b*d + a*b*c;
x56 = a*b*c*!d + a*b*!c*d + !a*!b*d;
x57 = !a*!b*d + a*b*d + a*b*c;
x58 = a*b*c*!d + a*b*!c*d + !a*c*d + !a*!b*d;
x59 = b*c*d + !a*!b*d + a*b*d + a*b*c;
x60 = a*b*c*!d + a*b*!c*d + !b*c*d + !a*c*d + !a*!b*d;
x61 = !a*!b*d + a*b*d + a*b*c + c*d;
x62 = a*b*c*!d + !a*!c*d + !a*!b*d;
x63 = !a*!c*d + !a*!b*d + a*b*c;
x64 = a*b*c*!d + !a*d;
x65 = a*b*c + !a*d;
x66 = a*b*c*!d + !a*!c*d + !b*c*d;
x67 = !a*!c*d + !b*c*d + a*b*c;
x68 = a*b*c*!d + !b*c*d + !a*d;
x69 = a*b*c + c*d + !a*d;
x70 = a*b*c*!d + b*!c*d + !a*!c*d + !b*c*d;
x71 = b*!c*d + !a*!c*d + !b*c*d + a*b*c;
x72 = a*b*c*!d + b*!c*d + !b*c*d + !a*d;
x73 = a*b*c + c*d + b*d + !a*d;
x74 = a*b*c*!d + !b*!c*d + !a*!c*d + !a*!b*d;
x75 = !b*!c*d + !a*!c*d + !a*!b*d + a*b*c;
x76 = a*b*c*!d + !b*!c*d + !a*d;
x77 = !b*!c*d + a*b*c + !a*d;
x78 = a*b*c*!d + !b*d + !a*d;
x79 = a*b*c + !b*d + !a*d;
x80 = a*b*c*!d + !c*d + !b*d + !a*d;
x81 = b*c*!d + b*!c*d + !b*c*d;
x82 = b*c*!d + b*!c*d + !b*c*d + a*c*d;
x83 = c*d + b*d + b*c;
x84 = b*c*!d + a*!c*d + a*!b*d + !a*b*c;
x85 = a*d + b*c;
x86 = !a*!b*c*d + b*c*!d + a*!c*d;
x87 = !a*!b*c*d + b*c*!d + a*!c*d + a*b*d;
x88 = b*c*!d + a*!c*d + !a*c*d;
x89 = a*!c*d + !a*c*d + b*c;
x90 = b*c*!d + a*!c*d + !b*c*d + !a*c*d;
x91 = c*d + a*d + b*c;
x92 = a*!b*!c*d + !a*b*!c*d + !a*!b*c*d + b*c*!d;
x93 = a*!b*!c*d + !a*b*!c*d + !a*!b*c*d + b*c*!d + a*b*c;
x94 = a*!b*!c*d + b*c*!d + a*!c*d + !a*b*d;
x95 = a*!b*!c*d + a*!c*d + !a*b*d + b*c;
x96 = !a*b*!c*d + b*c*!d + !b*c*d + a*!b*d;
x97 = !a*b*!c*d + b*c*!d + !b*c*d + a*c*d + a*!b*d;
x98 = b*c*!d + !b*c*d + a*!b*d + !a*b*d;
x99 = a*!b*d + !a*b*d + c*d + b*c;
x100 = b*c*!d + b*!c*d + a*!c*d + !b*c*d;
x101 = b*c*!d + b*!c*d + !b*c*d + a*d;
x102 = b*c*!d + a*!c*d + !b*c*d + !a*b*d;
x103 = b*c*!d + !b*!c*d;
x104 = b*c*!d + !b*!c*d + a*b*c;
x105 = !b*!c*d + b*c;
x106 = b*c*!d + !b*!c*d + a*c*d;
x107 = b*c*!d + !b*!c*d + a*!b*d + !a*b*c;
x108 = !b*!c*d + a*c*d + b*c;
x109 = !b*d + b*c;
x110 = b*c*!d + !b*!c*d + a*!c*d + a*!b*d;
x111 = b*c*!d + !b*!c*d + a*d;
x112 = b*c*!d + !b*!c*d + a*!c*d + a*!b*d + !a*b*c;
x113 = !b*!c*d + a*d + b*c;
x114 = b*c*!d + a*!c*d + !a*!b*d;
x115 = b*c*!d + !b*!c*d + !a*!b*d + a*b*d;
x116 = !b*!c*d + a*c*d + !a*c*d + b*c;
x117 = b*c*!d + a*!c*d + !b*d;
x118 = b*c*!d + !b*d + a*d;
x119 = b*c*!d + a*!c*d + !a*c*d + !b*d;
x120 = b*c*!d + !c*d + !b*d;
x121 = a*!b*c*!d + !a*b*c*!d + a*!b*!c*d + !a*b*!c*d;
x122 = a*!b*c*!d + !a*b*c*!d + a*!b*!c*d + !a*b*!c*d + a*b*c*d;
x123 = a*!b*c*!d + !a*b*c*!d + a*!b*!c*d + !a*b*!c*d + !a*b*c*d;
x124 = a*!b*c*!d + !a*b*c*!d + b*c*d + !a*b*d + !a*b*c;
x125 = a*!b*d + !a*b*d + a*!b*c + !a*b*c;
x126 = b*c*d + a*!b*d + !a*b*d + a*!b*c + !a*b*c;
x127 = a*!b*c*!d + !a*b*c*!d + a*!b*!c*d + !a*b*!c*d + !a*!b*c*d + a*b*c*d;
x128 = a*!b*c*!d + !a*b*c*!d + b*c*d + !a*c*d + !a*b*d + !a*b*c;
x129 = a*!b*d + !a*b*d + a*!b*c + !a*b*c + c*d;
x130 = a*!b*c*!d + b*!c*d + a*!c*d + !a*b*c;
x131 = a*!b*c*!d + a*!c*d + !a*b*c + b*d;
x132 = b*!c*d + a*!c*d + !a*b*c + !a*b*c;
x133 = a*!b*c*!d + !a*b*c*!d + !a*!b*c*d + b*!c*d + a*!c*d;
x134 = a*!b*c*!d + !a*b*c*!d + !a*!b*c*d + b*!c*d + a*!c*d + a*b*d;
x135 = a*!b*c*!d + b*!c*d + a*!c*d + !a*c*d + !a*b*c;
x136 = a*!b*c*!d + a*!c*d + !a*c*d + !a*b*c + b*d;
x137 = b*!c*d + a*!c*d + !b*c*d + a*!b*c + !a*b*c;
x138 = a*!b*c*!d + !a*b*c*!d + !a*!b*c*d + a*b*!c*d;
x139 = a*!b*c*!d + !a*b*c*!d + !a*!b*c*d + a*b*d;
x140 = a*!b*c*!d + !a*!b*c*d + a*b*d + !a*b*c;
x141 = !a*!b*c*d + a*!c*d + a*!b*c + !a*b*c;
x142 = !a*!b*c*d + a*b*d + a*!b*c + !a*b*c;
x143 = !a*!b*d + a*!c*d + a*!b*c + !a*b*c;
x144 = a*!b*c*!d + !a*b*c*!d + b*!c*d + !a*!c*d;
x145 = a*!b*c*!d + !a*b*c*!d + !a*!c*d + a*b*d;
x146 = a*!b*c*!d + b*!c*d + a*!c*d + !a*b*c;
x147 = a*!b*c*!d + !a*!c*d + a*!b*c + b*d;
x148 = !a*!b*d + a*!c*d + !a*!c*d + a*!b*c;
x149 = !a*b*c*!d + !a*!c*d + a*b*d + a*!b*c;
x150 = b*!c*d + !a*!c*d + a*!b*c + !a*b*c;
```

TABLE 4-continued

```
x151 = !a*!c*d + a*!b*c + !a*b*c + b*d;
x152 = a*!b*c*!d + !a*b*c*!d + b*!c*d + !a*!b*d + a*b*d;
x153 = !a*b*c*!d + !a*!c*d + !b*c*d + a*b*d + a*!b*c;
x154 = a*!b*c*!d + !a*b*c*!d + !c*d;
x155 = a*!b*c*!d + !a*b*c*!d + a*b*d + !c*d;
x156 = a*!b*c*!d + !a*b*c + !c*d;
x157 = a*!b*c + !a*b*c + !c*d;
x158 = a*!b*c*!d + !a*b*c*!d + !a*!b*d + a*b*d + !c*d;
x159 = a*c*!d + b*!c*d + a*!b*d + !a*b*c;
x160 = !a*!b*c*d + b*c*!d + a*c*!d + b*!c*d + a*!c*d;
x161 = !a*!b*c*d + b*c*!d + a*c*!d + b*!c*d + a*!c*d + a*b*d;
x162 = a*c*!d + b*!c*d + a*!c*d + !a*c*d + !a*b*c;
x163 = a*c*!d + b*!c*d + a*!c*d + !b*c*d + !a*b*c;
x164 = b*c*!d + a*c*!d + b*!c*d + !a*!c*d;
x165 = b*c*!d + a*c*!d + !a*!c*d + a*b*d;
x166 = b*c*!d + b*!c*d + !a*!c*d + a*!b*c;
x167 = b*c*!d + b*!c*d + !a*!c*d + a*c;
x168 = a*c*!d + b*!c*d + !a*!c*d + a*!b*c + !a*b*c;
x169 = b*c*!d + a*c*!d + b*!c*d + !a*!c*d + !b*c*d;
x170 = b*c*!d + a*c*!d + !b*!c*d + !a*!c*d;
x171 = b*c*!d + a*c*!d + !b*!c*d + !a*!c*d + a*b*c;
x172 = a*c*!d + !b*!c*d + !a*!c*d + !a*b*c;
x173 = a*c*!d + !b*!c*d + !a*!c*d + b*c;
x174 = a*c*!d + !a*!c*d + a*!b*d + !a*b*c;
x175 = b*c*!d + a*c*!d + !b*!c*d + !a*!c*d + !a*!b*d + a*b*c;
x176 = b*c*!d + a*c*!d + !c*d;
x177 = b*c*!d + a*c*!d + a*b*d + !c*d;
x178 = a*c*!d + !a*b*c + !c*d;
x179 = b*c*!d + a*c*!d + !a*!b*d + !c*d;
x180 = c*!d + !c*d;
x181 = a*b*!c*!d + a*!b*c*!d + !a*b*c*!d + a*!b*!c*d + !a*b*!c*d + !a*!b*c*d;
x182 = a*b*!c*!d + a*!b*c*!d + !a*b*c*!d + a*!b*!c*d + !a*b*!c*d + !a*!b*c*d + a*b*c*d;
x183 = a*b*!c*!d + a*!b*c*!d + !a*!b*c*!d + !a*c*d + !a*b*d + !a*b*c;
x184 = a*b*!c*!d + a*!b*c*!d + a*!b*!c*d + b*c*d + !a*c*d + !a*b*d + !a*b*c;
x185 = a*b*!c*!d + !b*c*d + a*!b*d + !a*b*d + a*!b*c + !a*b*c;
x186 = b*!c*d + a*!c*d + !b*c*d + a*!b*c + a*!b*c + !a*b*c;
x187 = a*b*!c*!d + a*!b*c*!d + !a*b*c*!d + !a*!b*!c*d + a*b*c*d;
x188 = a*b*!c*!d + a*!b*c*!d + !a*!b*!c*d + b*c*d + !a*b*c;
x189 = a*b*!c*!d + !a*!b*!c*d + a*!b*c + !a*b*c;
x190 = a*b*!c*!d + !a*!b*!c*d + b*c*d + a*!b*c + !a*b*c;
x191 = a*b*!c*!d + a*!b*c*!d + !a*b*c*!d + a*b*c*d + !a*!b*d;
x192 = a*b*!c*!d + a*!b*c*!d + b*c*d + !a*!b*d + !a*b*c;
x193 = a*b*!c*!d + !a*!b*d + a*!b*c + !a*b*c;
x194 = !a*!b*!c*d + a*b*!c + a*!b*c + !a*b*c;
x195 = !a*!b*!c*d + b*c*d + a*b*!c + a*!b*c + !a*b*c;
x196 = a*!b*c*!d + !a*b*c*!d + !a*!b*d + a*b*!c;
x197 = a*!b*c*!d + !a*b*c*!d + !a*!b*d + a*b*d + a*b*!c;
x198 = a*!b*c*!d + !a*!b*d + a*b*!c + !a*b*c;
x199 = a*!b*c*!d + b*c*d + !a*!b*d + a*b*!c + !a*b*c;
x200 = !a*!b*d + a*b*!c + a*!b*c + !a*b*c;
x201 = a*!b*!c*!d + a*!b*c*!d + !a*b*c*!d + a*b*c*d + !a*!c*d + !a*!b*d;
x202 = a*b*!c*!d + !a*b*c*!d + !a*!c*d + !b*c*d + a*!b*c;
x203 = a*b*!c*!d + !a*b*c*!d + !a*!c*d + !b*c*d + a*c*d + a*!b*c;
x204 = !a*b*c*!d + !a*!c*d + !b*c*d + a*b*!c + a*!b*c;
x205 = !a*b*c*!d + !a*!b*c*!d + !a*b*c*!d + a*b*c*d + !b*!c*d + !a*!c*d + !a*!b*d;
x206 = a*b*!d + b*!c*d + a*!c*d + !b*c*d + a*!b*c + !a*b*c;
x207 = a*b*!d + !a*!b*d + a*!b*c + !a*b*c;
x208 = !a*!b*!c*d + b*c*!d + a*b*!c + a*!b*c + !a*b*c;
x209 = b*c*!d + a*c*!d + !a*!b*d + a*b*!c;
x210 = a*c*!d + !a*!b*d + a*b*!c + !a*b*c;
x211 = b*c*!d + a*b*!d + !a*!c*d + !b*c*d + a*!b*c;
x212 = b*c*!d + a*c*!d + a*b*!d + !b*!c*d + !a*!c*d + !a*!b*d;
x213 = a*b*!c*!d + !a*!b*c*!d + !b*!c*d + a*c*d + !a*b*d;
```

TABLE 4-continued

```
x214 = !a*!b*c*!d + a*b*!d + !b*!c*d + !a*!c*d + a*b*c;
x215 = !a*!b*c*!d + a*b*!d + !b*!c*d + b*c*d + !a*b*d;
x216 = !a*!b*c*!d + a*b*!d + !b*!c*d + a*!b*d + !a*b*d;
x217 = !a*c*!d + a*b*!d + a*!c*d + !a*!b*d;
x218 = !a*c*!d + a*b*!d + !a*!c*d + a*!b*d;
x219 = a*b*!c*!d + a*b*c*d + !b*c*!d + !a*c*!d + !b*!c*d + !a*!c*d;
x220 = b*!c*!d + !b*c*!d + !b*!c*d + b*c*d;
x221 = a*!b*!c*!d + !a*b*!c*!d + !a*!b*c*!d + a*b*c*!d + !a*!b*!c*d + a*b*!c*d + a*!b*c*d + !a*b*c*d;
```

However, as Table 1 indicates, there are over 800,000 general logic functions in a library associated with a 5-input lookup table in accordance with the present invention. Although this library and libraries for lookup tables having even more inputs are impractical for implementation in an LBTMA at this time, the spirit of the present invention includes larger tables, and hardware capabilities may one day make these libraries practical. Further, an incomplete set including commonly used library elements from 5-input or more lookup tables, such as a 5-input AND gate and an 8-input AND gate, may be used to supplement the 223 library elements associated with a 4-input lookup table, thus increasing the power of the library for a nominal increase in size. Of course, libraries typically include other elements representing, e.g., flip-flops, I/O structures, three-state buffers, etc.

A second embodiment of a library defined in accordance with the present invention includes general logic functions representing groups of specific logic functions which differ by one or more inverted input signal only. In this second embodiment, specific logic functions differing by an inverted output are represented by different general logic functions. This embodiment yields a larger number of elements; therefore, more time is required to perform technology mapping and more memory is required to facilitate the library. For example, shown in Table 5 are 402 general logic functions associated with a library for a 4-input lookup table according to the second embodiment.

TABLE 5

```
x0 = 0;
x1 = a*b*c*d;
x2 = b*c*d;
x3 = a*!b*c*d + !a*b*c*d;
x4 = b*c*d + a*c*d;
x5 = c*d;
x6 = a*b*!c*d + a*!b*c*d + !a*b*c*d;
x7 = b*c*d + a*c*d + a*b*d;
x8 = a*b*!c*d + !a*!b*c*d;
x9 = !a*!b*c*d + a*b*d;
x10 = !a*c*d + a*b*d;
x11 = a*b*!c*d + !b*c*d + !a*c*d;
a12 = a*b*d + c*d;
x13 = b*!c*d + !b*c*d;
x14 = b*!c*d + !b*c*d + a*c*d;
x15 = c*d + b*d;
x16 = a*!b*!c*d + !a*b*!c*d + !a*!b*c*d + a*b*c*d;
x17 = a*!b*!c*d + b*c*d + !a*c*d + !a*b*d;
x18 = a*!b*d + !a*b*d + c*d;
x19 = a*!c*d + !b*c*d + !a*b*d;
x20 = c*d + b*d + a*d;
x21 = d;
x22 = a*b*c*!d + a*b*!c*d + a*!b*c*d + !a*b*c*d;
x23 = b*c*d + a*c*d + a*b*d + a*b*c;
x24 = a*b*c*!d + !a*!b*c*d + !a*b*c*d;
x25 = !a*!b*c*d + a*b*d + a*b*c;
x26 = a*b*c*!d + a*b*!c*d + !a*c*d;
x27 = !a*c*d + a*b*d + a*b*c;
x28 = a*b*c*!d + a*b*!c*d + !b*c*d + !a*c*d;
```

TABLE 5-continued

```
x29 = a*b*d + a*b*c + c*d;
x30 = a*b*c*!d + !a*b*!c*d + !b*c*d;
x31 = !a*b*!c*d + !b*c*d + a*b*c;
x32 = !a*b*d + a*b*c + c*d;
x33 = a*b*c*!d + b*!c*d + !b*c*d;
x34 = b*!c*d + !b*c*d + a*b*c;
x35 = a*b*c*!d + b*!c*d + !b*c*d + !a*c*d;
x36 = a*b*c + c*d + b*d;
x37 = a*b*c*!d + a*!b*!c*d + !a*b*!c*d + !a*!b*c*d;
x38 = a*!b*!c*d + !a*b*!c*d + !a*!b*c*d + a*b*c;
x39 = a*!b*!c*d + a*!b*!c*d + !a*c*d + !a*b*d;
x40 = a*!b*!c*d + !a*c*d + !a*b*d + a*b*c;
x41 = a*b*c*!d + !b*c*d + a*!b*d + !a*b*d;
x42 = a*!b*d + !a*b*d + a*b*c + a*d;
x43 = a*b*c*!d + a*!c*d + !b*c*d + !a*b*d;
x44 = a*b*c + c*d + b*d + a*d;
x45 = a*b*c*!d + !a*b*!c*d;
x46 = !a*!b*!c*d + a*b*c;
x47 = a*b*c*!d + !a*!b*!c*d + !a*b*c*d;
x48 = !a*!b*!c*d + b*c*d + a*b*c;
x49 = a*b*c*!d + !a*!b*!c*d + a*!b*c*d + !a*b*c*d;
x50 = !a*!b*!c*d + b*c*d + a*c*d + a*b*c;
x51 = !a*!b*d + a*b*c;
x52 = b*c*d + !a*!b*d + a*b*c;
x53 = !a*!b*d + !a*b*d + a*b*c + c*d;
x54 = a*b*c*!d + !a*!b*!c*d + a*b*!c*d + a*!b*c*d + !a*b*c*d;
x55 = !a*!b*!c*d + b*c*d + a*c*d + a*b*d + a*b*c;
x56 = a*b*c*!d + a*b*!c*d + !a*!b*d;
x57 = !a*!b*d + a*b*d + a*b*c;
x58 = a*b*c*!d + a*b*!c*d + !a*c*d + !a*!b*d;
x59 = b*c*d + !a*!b*d + a*b*d + a*b*c;
x60 = a*b*c*!d + a*b*!c*d + !b*c*d + !a*c*d + !a*!b*d;
x61 = !a*!b*d + a*b*d + a*b*c + c*d;
x62 = a*b*c*!d + !a*!c*d + !a*!b*d;
x63 = !a*!c*d + !a*!b*d + a*b*c;
x64 = a*b*c*!d + !a*d;
x65 = a*b*c + !a*d;
x66 = a*b*c*!d + !a*!c*d + !b*c*d;
x67 = !a*!c*d + !b*c*d + a*b*c;
x68 = a*b*c*!d + !b*c*d + !a*d;
x69 = a*b*c + c*d + !a*d;
x70 = a*b*c*!d + b*!c*d + !a*!c*d + !b*c*d;
x71 = b*!c*d + !a*!c*d + !b*c*d + a*b*c;
x72 = a*b*c*!d + b*!c*d + !b*c*d + !a*d;
x73 = a*b*c + c*d + b*d + !a*d;
x74 = a*b*c*!d + !b*!c*d + !a*!c*d + !a*!b*d;
x75 = !b*!c*d + !a*!c*d + !a*!b*d + a*b*c;
x76 = a*b*c*!d + !b*!c*d + !a*d;
x77 = !b*!c*d + a*b*c + !a*d;
x78 = a*b*c*!d + !b*d + !a*d;
x79 = a*b*c + !b*d + !a*d;
x80 = a*b*c*!d + !c*d + !b*d + !a*d;
x81 = a*b*c + d;
x82 = b*c*!d + b*!c*d + !b*c*d;
x83 = b*c*!d + b*!c*d + !b*c*d + a*c*d;
x84 = c*d + b*d + b*c;
x85 = b*c*!d + a*!c*d + a*!b*d + !a*b*c;
x86 = a*d + b*c;
x87 = a*!b*c*d + b*c*!d + a*!c*d;
x88 = !a*!b*c*d + b*c*!d + a*!c*d + a*b*d;
x89 = b*c*!d + a*!c*d + !a*c*d;
x90 = a*!c*d + !a*c*d + b*c;
x91 = b*c*!d + a*!c*d + !b*c*d + !a*c*d;
x92 = c*d + a*d + b*c;
x93 = a*!b*!c*d + !a*b*!c*d + !a*!b*c*d + b*c*!d;
x94 = a*!b*!c*d + !a*b*!c*d + !a*!b*c*d + b*c*!d + a*b*c;
x95 = a*!b*!c*d + b*c*!d + !a*c*d + !a*b*d;
x96 = a*!b*!c*d + !a*c*d + !a*b*d + b*c;
x97 = !a*!b*c*d + b*c*!d + !b*c*d + a*!b*d;
x98 = !a*!b*c*d + b*c*!d + !b*c*d + a*c*d + a*!b*d;
x99 = b*c*!d + !b*c*d + a*!b*d + !a*b*d;
x100 = a*!b*d + !a*b*d + c*d + b*c;
x101 = b*c*!d + b*!c*d + a*!c*d + !b*c*d;
x102 = b*c*!d + b*!c*d + !b*c*d + a*d;
x103 = b*c*!d + a*!c*d + !b*c*d + !a*b*d;
x104 = c*d + b*d + a*d + b*c;
x105 = b*c*!d + !b*!c*d;
x106 = b*c*!d + !b*!c*d + a*b*c;
x107 = !b*!c*d + b*c;
x108 = b*c*!d + !b*!c*d + a*c*d;
x109 = b*c*!d + !b*!c*d + a*!b*d + !a*b*c;
x110 = !b*!c*d + a*c*d + b*c;
x111 = !b*d + b*c;
x112 = b*c*!d + !b*!c*d + a*!c*d + a*!b*d;
x113 = b*c*!d + !b*!c*d + a*d;
x114 = b*c*!d + !b*!c*d + a*!c*d + a*!b*d + !a*b*c;
x115 = !b*!c*d + a*d + b*c;
x116 = b*c*!d + a*!c*d + !a*!b*d;
x117 = b*c*!d + !b*!c*d + !a*!b*d + a*b*d;
x118 = !b*!c*d + a*!c*d + !a*c*d + b*c;
x119 = b*c*!d + a*!c*d + !b*d;
x120 = b*c*!d + !b*d + a*d;
x121 = b*c*!d + a*!c*d + !a*c*d + !b*d;
x122 = !b*d + a*d + b*c;
x123 = b*c*!d + !c*d + !b*d;
x124 = b*c*!d + !c*d + !b*d + a*d;
x125 = b*c + d;
x126 = a*!b*!c*!d + !a*b*c*!d + a*!b*!c*d + !a*b*!c*d;
x127 = a*!b*!c*!d + !a*b*c*!d + a*!b*!c*d + !a*b*!c*d + a*b*c*d;
x128 = a*!b*!c*!d + !a*b*c*!d + a*!b*!c*d + !a*b*!c*d + !a*b*c*d;
x129 = a*!b*!c*!d + a*!b*!c*d + b*c*d + !a*b*d + !a*b*c;
x130 = !a*b*d + !a*b*d + a*!b*c + !a*b*c;
x131 = b*c*d + a*!b*d + !a*b*d + a*!b*c + !a*b*c;
x132 = a*!b*!c*!d + !a*b*c*!d + a*!b*!c*d + !a*b*!c*d + !a*!b*c*d + a*b*c*d;
x133 = a*!b*!c*!d + a*!b*!c*d + b*c*d + !a*c*d + !a*b*d + !a*b*c;
x134 = a*!b*d + !a*b*d + a*!b*c + !a*b*c + c*d;
x135 = a*!b*!c*d + b*!c*d + a*!c*d + !a*b*c;
x136 = a*!b*!c*d + a*!c*d + !a*b*c + b*d;
x137 = b*!c*d + a*!c*d + a*!b*c + !a*b*c;
x138 = a*!b*c + !a*b*c + b*d + a*d;
x139 = a*!b*!c*!d + !a*b*c*!d + !a*!b*c*d + b*!c*d; + a*!c*d;
x140 = a*!b*!c*!d + !a*b*c*!d + !a*!b*c*d + b*!c*d + a*!c*d + a*b*d;
x141 = a*!b*!c*!d + b*!c*d + a*!c*d + !a*c*d + !a*b*c;
x142 = a*!b*!c*!d + a*!c*d + !a*c*d + !a*b*c + b*d;
x143 = b*!c*d + a*!c*d + !b*c*d + a*!b*c + !a*b*c;
x144 = a*!b*c + !a*b*c + c*d + b*d + a*d;
x145 = a*!b*!c*!d + !a*b*c*!d + !a*!b*c*d + a*!b*c*d;
x146 = a*!b*!c*!d + !a*b*!c*d + !a*!b*c*d + a*b*d;
x147 = a*!b*!c*!d + !a*!b*!c*d + a*!b*d + !a*b*c;
x148 = !a*!b*!c*d + a*!b*!c*d + a*!b*c + !a*b*c;
x149 = !a*!b*!c*d + a*!b*!c*d + a*!b*c + !a*b*c;
x150 = !a*!b*d + a*!b*d + a*!b*c + !a*b*c;
x151 = a*!b*!c*!d + !a*b*c*!d + b*!c*d + !a*!c*d;
x152 = a*!b*!c*!d + !a*b*c*!d + !a*!c*d + a*b*d;
x153 = b*!c*d + a*!c*d + !a*!c*d + a*!b*c;
x154 = a*!b*!c*!d + !a*!c*d + !a*b*c + b*d;
x155 = !a*b*c*!d + b*!c*d + !a*!c*d + a*!b*c;
x156 = !a*b*c*!d + !a*!c*d + a*b*d + a*!b*c;
x157 = b*!c*d + !a*!c*d + a*!b*c + b*d;
x158 = !a*!c*d + a*!b*c + !a*b*c + b*d;
x159 = a*!b*!c*!d + !a*b*c*!d + b*!c*d + !a*!b*d + a*b*d;
x160 = a*!b*!c*!d + a*!b*c + b*d + !a*d;
x161 = !a*b*c*!d + !a*!c*d + b*!c*d + a*b*d + a*!b*c;
x162 = a*!b*c + a*!b*c + b*d + !a*d;
x163 = a*!b*!c*!d + !a*b*c*!d + !c*d;
x164 = a*!b*!c*!d + !a*b*c*!d + a*b*d + !c*d;
x165 = a*!b*!c*d + !a*b*c + !c*d;
x166 = a*!b*!c*d + !a*b*c + !c*d + d*d;
x167 = a*!b*c + !a*b*c + !c*d;
x168 = a*!b*c + !a*b*c + !c*d + b*d;
x169 = a*!b*!c*d + !a*b*c*!d + !a*!b*d + a*b*d + !c*d;
x170 = a*!b*!c*d + !a*b*c + !c*d + b*d + !a*d;
x171 = a*!b*c + !a*b*c + d;
x172 = a*c*!d + b*!c*d + a*!b*d + !a*b*c;
x173 = b*d + a*d + b*c + a*c;
x174 = !a*!b*c*d + a*c*!d + b*!c*d + a*!c*d;
x175 = !a*!b*c*d + b*c*!d + a*c*!d + b*!c*d + a*!c*d + a*b*d;
x176 = a*c*!d + b*!c*d + a*!c*d + !a*c*d + !a*b*c;
x177 = a*c*!d + a*!c*d + !a*c*d + b*d + b*c;
x178 = a*c*!d + b*!c*d + a*!c*d + !b*c*d + !a*b*c;
x179 = c*d + b*d + a*d + b*c + a*c;
x180 = b*c*!d + a*c*!d + b*!c*d + !a*!c*d;
x181 = b*c*!d + a*c*!d + !a*!c*d + a*b*d;
```

TABLE 5-continued x182 = a*c*!d + !a*!c*d + b*d + b*c;
x183 = b*c*!d + b*!c*d + !a*!c*d + a*!b*c;
x184 = b*c*!d + b*!c*d + !a*!c*d + a*c;
x185 = a*c*!d + b*!c*d + !a*!c*d + a*!b*c + !a*b*c;
x186 = !a*!c*d + b*d + b*c + a*c;
x187 = b*c*!d + a*c*!d + b*!c*d + !a*!c*d + !b*c*d;
x188 = b*c*!d + b*!c*d + !a*!c*d + !b*c*d + a*c;
x189 = b*d + !a*d + b*c + a*c;
x190 = b*c*!d + a*c*!d + !b*!c*d + !a*!c*d;
x191 = b*c*!d + a*c*!d + !b*!c*d + !a*!c*d + a*b*c;
x192 = a*c*!d + !b*!c*d + !a*!c*d + b*c + !a*b*c;
x193 ≤ a*c*!d + !b*!c*d + !a*!c*d + b*c;
x194 = a*c*!d + !a*!c*d + a*!b*d + !a*b*c;
x195 = !b*!c*d + !a*!c*d + b*c + a*c;
x196 = b*c*!d + a*c*!d + !b*!c*d + !a*!c*d + !a*!b*d + a*b*c;
x197 = a*c*!d + !b*!c*d + !a*d + b*c;
x198 = !b*d + !a*d + b*c + a*c;
x199 = b*c*!d + a*c*!d + !c*d;
x200 = b*c*!d + a*c*!d + a*b*d + !c*d;
x201 = a*c*!d + !a*b*c + !c*d;
x202 = a*c*!d + !c*d + b*c;
x203 = a*c*!d + a*!b*d + !a*b*c + !c*d;
x204 = !c*d + b*c + a*c;
x205 = a*c*!d + a*!b*d + !a*!b*d + !c*d;
x206 = b*c*!d + a*c*!d + !a*!b*d + a*b*d + !c*d;
x207 = a*c*!d + !a*b*c + !c*d + !a*d;
x208 = a*c*!d + !c*d + !a*d + b*c;
x209 = a*c*!d + !a*b*c + !c*d + !b*d;
x210 = b*c + a*c + d;
x211 = c*!d + !c*d;
x212 = a*b*d + c*!d + !c*d;
x213 = c*!d + !c*d + b*d;
x214 = a*!b*d + !a*b*d + c*!d + !c*d;
x215 = c*!d + !c*d + b*d + a*d;
x216 = d + c;
x217 = a*b*!c*!d + !a*!b*c*!d + !a*b*c*!d + a*!b*!c*d + !a*b*!c*d + !a*!b*c*d;
x218 = a*b*!c*!d + a*!b*c*!d + !a*b*c*!d + a*!b*!c*d + !a*b*!c*d + !a*!b*c*d + a*b*c*d;
x219 = a*b*!c*!d + a*!b*c*!d + a*!b*!c*d + !a*c*d + !a*b*d + !a*b*c;
x220 = a*b*!c*!d + a*!b*c*!d + a*!b*!c*d + b*c*d + !a*c*d + !a*b*d + !a*b*c;
x221 = a*b*!c*!d + !b*c*d + a*!b*d + !a*b*d + a*!b*c + !a*b*c;
x222 = a*b*!c*!d + a*!b*d + !a*b*d + a*!b*c + !a*b*c + c*d;
x223 = b*!c*d + a*!c*d + !b*c*d + a*b*!c + a*b*c + !a*b*c;
x224 = a*b*!c + a*!b*c + !a*b*c + c*d + b*d + a*d;
x225 = a*b*!c*!d + a*!b*c*!d + !a*b*c*!d + !a*!b*c*!d + a*b*c*d;
x226 = a*b*!c*!d + a*!b*c*!d + !a*!b*c*!d + b*c*d + !a*c*d;
x227 = a*b*!c*!d + !a*!b*!c*!d + a*!b*c + !a*b*c;
x228 = a*b*!c*!d + !a*!b*c*!d + b*c*d + a*!b*c + !a*b*c;
x229 = a*b*!c*!d + a*!b*c*!d + !a*b*c*!d + a*b*c*d + !a*!b*d;
x230 = a*b*!c*!d + a*!b*c*!d + b*c*d + !a*!b*d + !a*b*c;
x231 = a*b*!c*!d + !a*!b*d + a*!b*c + !a*b*c;
x232 = a*b*!c*!d + !a*!b*d + a*!b*c + !a*b*c + c*d;
x233 = !a*!b*!c*d + a*b*!c + a*!b*c + !a*b*c;
x234 = !a*!b*!c*d + b*c*d + a*b*!c + a*!b*c + !a*b*c;
x235 = a*!b*!c*d + !a*!b*c*d + !a*!b*d + a*b*!c;
x236 + a*!b*!c*d + !a*b*c*!d + !a*!b*d + a*b*d + a*b*!c;
x237 = a*!b*c*!d + !a*!b*d + a*b*!c + !a*b*c;
x238 = a*!b*c*!d + b*c*d + !a*!b*d + a*b*!c + !a*b*c;
x239 = !a*!b*d + a*b*!c + a*!b*c + !a*b*c;
x240 = !a*!b*d + a*b*!c + a*!b*c + !a*b*c + c*d;
x241 = a*b*!c*!d + a*!b*c*!d + !a*b*c*!d + a*b*c*d + !a*!c*d + !a*!b*d;
x242 = a*b*!c*!d + a*!b*c*!d + b*c*d + !a*b*c + !a*d;
x243 = a*b*!c*!d + !a*b*c*!d + !a*!c*d + !b*c*d + a*!b*c;
x244 = a*b*!c*!d + !a*b*c*!d + !a*!c*d + !b*c*d + a*c*d + a*!b*c;
x245 = a*b*!c*!d + a*!b*c + !a*b*c + !a*d;
x246 = a*b*!c*!d + a*!b*c + !a*b*c + c*d + !a*d;
x247 = !a*b*c*!d + !a*!c*d + !b*c*d + a*b*!c + a*!b*c;
x248 = !a*b*c*!d + !a*!c*d + !b*c*d + a*c*d + a*b*!c + a*!b*c;
x249 = a*b*!c + a*!b*c + !a*b*c + !a*d;
x250 = a*b*!c + a*!b*c + !a*b*c + c*d + !a*d;
x251 = !a*b*!c*!d + a*!b*c*!d + !a*b*c*!d + a*b*c*d + !b*!c*d + !a*!c*d + !a*!b*d;
x252 = a*b*!c*!d + a*!b*c*!d + !b*!c*d + !a*b*c + !a*d;

x253 = a*b*!c*!d + a*!b*c*!d + !b*!c*d + b*c*d + !a*b*c + !a*d;
x254 = a*b*!c*!d + a*!b*c + !a*b*c + !b*d + !a*d;
x255 = a*b*!c*!d + a*!b*c + !a*b*c + c*d + !b*d + !a*d;
x256 = a*b*!c + a*!b*c + !a*b*c + c*d + !b*d;
x257 = a*b*!c + a*!b*c + !a*b*c + d;
x258 = a*b*!d + b*!c*d + a*!c*d + !b*c*d + a*!b*c + !a*b*c;
x259 = c*d + b*d + a*d + b*c + a*c + a*b;
x260 = !a*!b*!c*d + b*c*!d + a*c*!d + a*b*!d + a*b*c;
x261 = !a*!b*!c*d + a*c*!d + a*b*!d + b*c;
x262 = !a*!b*!c*d + a*b*!d + b*c + a*c;
x263 = b*c*!d + a*c*!d + a*b*!d + !a*!b*d + a*b*c;
x264 = a*c*!d + a*b*!d + !a*!b*d + b*c;
x265 = a*b*!d + !a*!b*d + a*!b*c + !a*b*c;
x266 = !a*!b*!d + !a*!b*d + b*c + a*c;
x267 = !a*!b*!c*d + b*c*!d + a*b*!c + a*!b*c + !a*b*c;
x268 = !a*!b*!c*d + b*c + a*c + a*b;
x269 = b*c*!d + a*c*!d + !a*!b*d + a*b*!c;
x270 = b*c*!d + a*c*!d + !a*!b*d + a*b;
x271 = a*c*!d + !a*!b*d + a*b*!c + !a*b*c;
x272 = a*c*!d + !a*!b*d + b*c + a*b;
x273 = a*c*!d + !b*c*!d + !a*!b*d + a*b*!c + !a*b*c;
x274 = !a*!b*d + b*c + a*c + a*b;
x275 = b*c*!d + a*c*!d + a*b*!d + !a*!c*d + !a*!b*d + a*b*c;
x276 = a*c*!d + a*b*!d + !a*d + b*c;
x277 = b*c*!d + a*b*!d + !a*!c*d + !b*c*d + a*!b*c;
x278 = b*c*!d + a*b*!d + !a*!c*d + !b*c*d + a*c;
x279 = b*c*!d + a*b*!d + a*!b*c + !a*d;
x280 = a*b*!d + !a*d + b*c + a*c;
x281 = b*c*!d + a*b*!d + b*!c*d + !a*!c*d + !b*c*d + a*!b*c;
x282 = b*c*!d + !a*!c*d + !b*c*d + a*c + a*b;
x283 = b*c*!d + a*b*!d + b*!c*d + a*!b*c + !a*d;
x284 = !a*d + b*c + a*c + a*b;
x285 = b*c*!d + a*c*!d + a*b*!d + !b*!c*d + !a*!c*d + !a*!b*d;
x286 = b*c*!d + a*c*!d + a*b*!d + !b*!c*d + !a*!c*d + !a*!b*d + a*b*c;
x287 = a*c*!d + a*b*!d + !b*!c*d + !a*b*c + !a*d;
x288 = a*c*!d + a*b*!d + !b*!c*d + !a*d + b*c;
x289 = a*b*!d + a*!b*c + !a*b*c + !b*d + !a*d;
x290 = a*b*!d + !b*d + !a*d + b*c + a*c;
x291 = a*b*!d + a*!b*c + !a*b*c + !c*d + !b*d;
x292 = b*c + a*c + a*b + d;
x293 = a*b*!c*!d + !a*!b*c*!d + !b*!c*d + a*c*d + a*b*!d;
x294 = a*b*!c*!d + !a*!b*c*!d + !a*!b*c + c*d + !b*d + !a*d;
x295 = a*b*!c + !a*!b*c + d;
x296 = !a*!b*c*!d + a*b*!d + !b*!c*d + !a*!c*d + a*b*c;
x297 = !a*!b*c*!d + a*b*!d + !b*!c*d + b*c*d + !a*b*d;
x298 = !a*!b*c*!d + a*b*!d + !b*!c*d + a*!b*d + a*b*d;
x299 = !a*!b*c*!d + a*b*!d + !b*!c*d + a*c*d + !a*b*d;
x300 = a*b*!d + !b*!c*d + !a*c*d + !a*!b*c + a*b*c;
x301 = a*b*!d + !b*!c*d + !a*b*c + !a*d;
x302 = a*b*!d + !b*!c*d + b*c*d + !a*b*c + !a*d;
x303 = a*b*!d + !a*!b*c + !b*d + !a*d;
x304 = a*b*!d + !a*!b*c + c*d + !b*d + !a*d;
x305 = !a*!b*c*!d + !c*d + a*b;
x306 = !a*!b*c*!d + !c*d + b*d + a*b;
x307 = !a*!b*c*!d + a*!b*d + !a*b*d + !a*b*c + !c*d;
x308 = !a*!b*c*!d + !c*d + b*d + a*d + a*b;
x309 = a*b*!d + !a*!b*c + !c*d;
x310 = !a*!b*c + !c*d + a*b;
x311 = !a*!b*c + !c*d + b*d + a*b;
x312 = !a*!b*c + !c*d + b*d + a*b;
x313 = a*b*!d + !a*!b*c + !c*d + !b*d + !a*d;
x314 = !a*!b*c + a*b + d;
x315 = !a*c*!d + a*b*!d + !b*!c*d + a*!c*d + a*!b*d + !a*b*d;
x316 = !a*c*!d + !b*!c*d + a*d + b*c + a*b;
x317 = !a*c*!d + a*b*!d + a*!c*d + !a*b*d;
x318 = !a*c*!d + !b*!c*d + !a*b*d + a*b;
x319 = !b*!c*d + !a*c + a*b;
x320 = a*b*!d + a*!c*d + !b*d + !a*d;
x321 = !b*d + !a*c + a*b;
x322 = !a*c*!d + a*b*!d + !a*!c*d + a*!b*d;
x323 = !a*c*!d + a*b*!d + !b*!c*d + !a*!c*d + a*c*d;
x324 = !a*c*!d + a*b*!d + !b*!c*d + a*c*d + a*!b*d;
x325 = !a*c*!d + a*b*!d + !a*!c*d + !b*d;
x326 = !a*c*!d + a*b*!d + !a*!c*d + a*c*d + !b*d;
x327 = a*b*!d + !b*d + !a*d + !a*c;
x328 = a*b*!d + c*d + !b*d + !a*d + !a*c;

TABLE 5-continued

```
x329 = !a*c*!d + a*b*!d + !c*d + !b*d;
x330 = !a*c*!d + !c*d + !b*d + a*b;
x331 = !a*c = a*b + d;
x332 = a*b*!c*!d + a*b*c*d + !b*c*!d + !a*c*!d + !b*!c*d + !a*!c*d;
x333 = a*b*!c*!d + !b*c*!d + !b*!c*d + !a*!c*d + b*c*d + !a*b*c;
x334 = a*b*!c*!d + !b*c*!d + !a*!c*d + a*!b*d + !a*b*c;
x335 = a*b*!c*!d + !b*c*!d + !b*!c*d + !a*!c*d +a*c*d + !a*b*c;
x336 = a*b*!c*!d + a*b*c*d + !b*c*!d + !a*c*!d + !b*!c*d + !a*!c*d + !a*!b*d;
x337 = a*b*!c*!d + !b*c*!d + !b*!c*d + b*c*d + !a*d + !a*c;
x338 = a*b*!c*!d + !b*d + !a*d + !b*c + !a*c;
x339 = a*b*!c*!d + c*d + !b*d + !a*d + !b*c + !a*c;
x340 = !b*c*!d + !a*c*!d + a*b*d + a*b*!c + !c*d;
x341 = !b*c*!d + a*b*!c + !a*b*c + !c*d + b*d;
x342 = !b*c*!d + a*!b*d + a*b*!c + !a*b*c + !c*d;
x343 = !b*c*!d + a*b*!c + !a*b*c + !c*d + a*d;
x344 = !b*c*!d + !a*c*!d + !a*!b*d + a*b*d + a*b*!c + !c*d;
x345 = !b*c*!d + a*b*!c + !c*d + !a*c;
x346 = !b*c*!d + a*b*!c + !c*d + b*d + !a*c;
x347 = a*b*!c + !c*d + !b*c + !a*c;
x348 = a*b*!c + !b*c + !a*c + d;
x349 = c*!d + !c*d + a*b;
x350 = a*b*!d + !a*b*d + c*!d + !c*d;
x351 = c*!d + !c*d + b*d + a*b;
x352 = a*b*!d + a*!b*d + !a*b*d + c*!d + !c*d;
x353 = c*!d + !c*d + b*d + a*d + a*b;
x354 = a*b*!d + !a*!b*d + c*!d + !c*d;
x355 = !a*!b*d + c*!d + !c*d + a*b;
x356 = a*b*!d + c*!d + !c*d + !a*d;
x357 = c*!d + !c*d + !a*c + a*b;
x358 = a*b*!d + !c*d + !b*c + !a*c;
x359 = a*b + d + c;
x360 = b*!c*!d + !b*c*!d + !b*!c*d + b*c*d;
x361 = b*!c*!d + !b*c*!d + !b*!c*d + b*c*d + a*c*d;
x362 = b*!c*!d + c*d + !b*d + !b*c;
x363 = b*!c*!d + !b*c*!d + !b*!c*d + b*c*d + a*d;
x364 = b*!c*!d + !b*c*!d + !b*!c*d + !a*c*d + a*b*d;
x365 = b*!c*!d + c*d + !b*d + a*d + !b*c;
x366 = b*!c + !b*c + d;
x367 = !a*b*c*d + b*!c*!d + !b*c*!d + a*c*!d + !b*!c*d + a*!c*d + a*!b*d;
x368 = b*!c*!d + !b*c*!d + !b*!c*d + b*c*d + a*d + a*b;
x369 = b*!c*!d + !b*c*!d + a*c*!d + !b*!c*d + a*!c*d + !a*c*d;
x370 = b*!c*!d + !b*c*!d + !b*!c*d + !a*c*d + a*b;
x371 = b*!c*!d + a*c*!d + a*!c*d + !a*c*d + !b*d + !b*c;
x372 = b*!c*!d + c*d + !b*d + !b*c + a*b;
x373 = b*!c*!d + !a*!c*d + !b*d + !b*c + a*c;
x374 = b*!c*!d + !b*d + !a*d + !b*c + a*c;
x375 = !c*d + b*⩤c + !b*c + a*c;
x376 = a*c*!d + !c*d + !a*d + b*!c + !b*c;
x377 = b*!c + !b*c + a*c + d;
x378 = b*!d + !c*d + !b*c;
x379 = b*!d + !c*d + a*d + !b*c;
x380 = d + c + b;
x381 = a*!b*!c*!d + !a*b*!c*!d + !a*!b*c*!d + a*b*c*!d + !a*!b*!c*d + a*b*!c*d + a*!b*c*d + !a*b*c*d;
x382 = a*!b*!c*!d + !a*b*!c*!d + !a*!b*c*!d + !a*!b*!c*d + b*c*d + a*c*d + a*b*d + a*b*c;
x383 = a*!b*!c*!d + !a*b*!c*!d + !a*!b*d + a*b*d + !a*!b*c + a*b*c + c*d;
x384 = a*!b*!c*!d + !a*b*!c + !a*!b*c + a*b*c + c*d + b*d + !a*d;
x385 = a*!b*!c + !a*b*!c + !a*!b*c + a*b*c + d;
x386 = a*!b*!c*!d + !a*b*!d + b*!c*d + !a*!c*d + !b*c*d + !a*!b*c + a*b*c;
x387 = a*!b*!c*!d + c*d + b*d + !a*d + b*c + !a*c + !a*b;
x388 = b*!c*!d + !a*c*!d + !a*b*!d + !b*!c*d + a*!c*d + a*!b*d + a*!b*!c + !a*b*c;
x389 = !a*c*!d + !a*b*!d + !b*!c*d + a*!b*!c + a*d + b*c;
x390 = !a*b*!d + a*!b*!c + !b*d + a*d + b*c + !a*c;
x391 = !a*b*!d + a*!b*!c + !a*b*c + a*b*c + !c*d + !b*d;
x392 = a*!b*!c + b*c + !a*c + !a*b + d;
x393 = c*!d + !c*d + a*!b + !a*b;
x394 = c*!d + !c*d + b*d + a*!b + !a*b;
x395 = a*!b*!d + !a*b*!d + !a*!b*c + a*b*c + !c*d;
x396 = a*!b*!d + c*!d + !c*d + b*d + !a*d + !a*b;
x397 = a*!b + !a*b + d + c;
x398 = a*!c + !b*c + !a*b + d;
x399 = a*!d + !c*d + !b*c + !a*b;
x400 = d + c + b + a;
x401 = 1;
```

The above libraries shown in Tables 2–5 include all general logic functions needed to represent all specific logic functions implemented by an n-input lookup table (or equivalent structure such as discussed in connection with FIGS. 2c–2f). However, one of ordinary skill in the art would recognize that some of the general logic functions could be omitted if it was determined they would never or rarely be used and could be implemented (although less efficiently) by the remaining library elements.

Process for Programming

Figure 7:
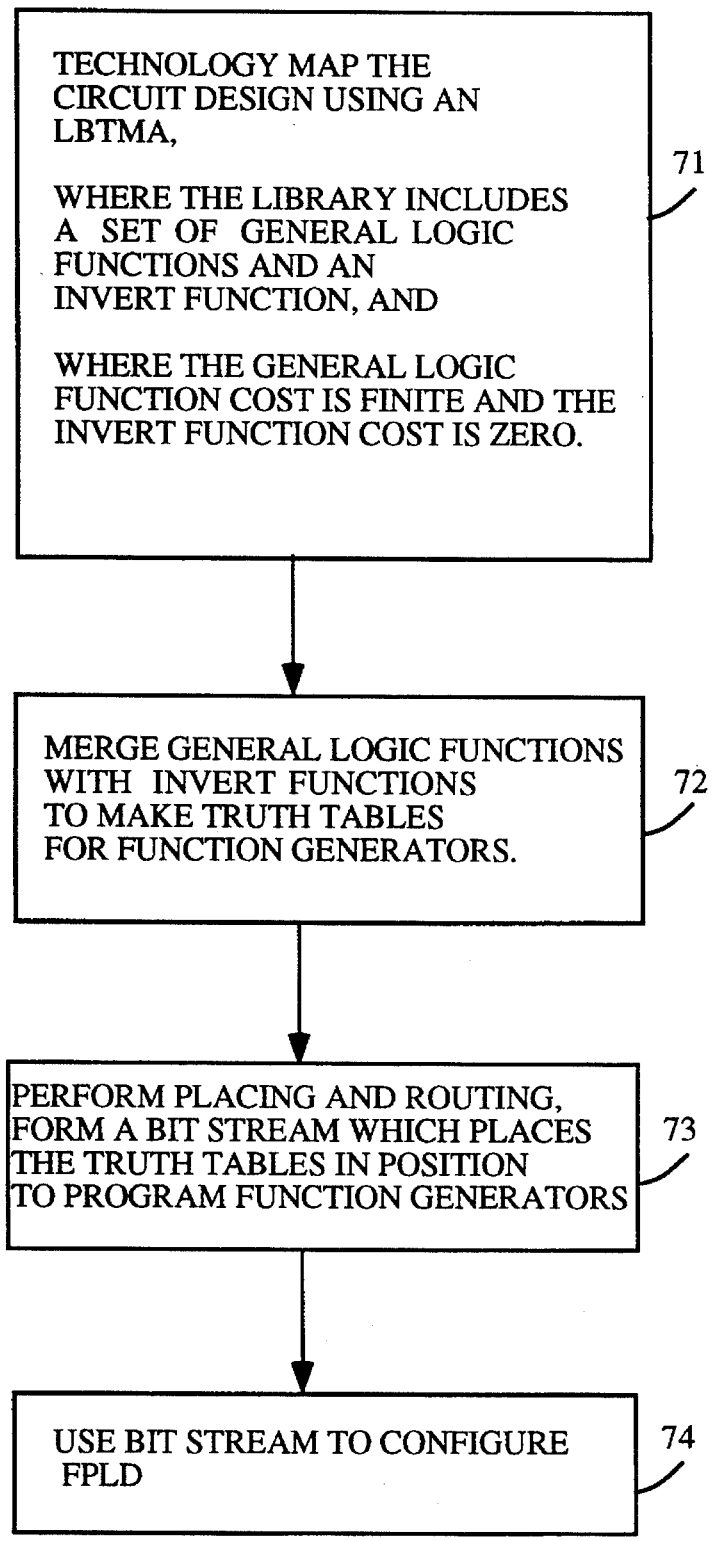
FIG. 7 is a block diagram showing the method of programming according to the present invention.

As shown in FIG. 7, a method for programming a lookup table-based or equivalent FPLD according to the present invention includes step 71 of technology mapping a circuit design using an LBTMA, for example a prior art LBTMA, where, according to a novel feature of this invention, the LBTMA references one of the unique libraries (discussed above) which include general logic functions and an invert function which are used to represent some or all of the $2^{2^n}$ specific logic functions implemented by an n-input lookup table-based FPLD, addressing $2^n$ memory locations or data signals, and where each of the general logic functions has been assigned a finite cost and the inverter has been assigned zero cost. In another embodiment a very small cost is assigned to invert functions which causes the LBTMA to favor fewer added invert functions, which simplifies merge processes (discussed below). In another embodiment, if the circuit design includes more than n input signals, the step of technology mapping also includes dividing the circuit design into logic portions, each logic portion having n input signals (or less) and one output signal.

In one embodiment, the library includes the set of general logic functions, each general logic function representing a group of specific logic functions, the specific logic functions of each group differing by one or more inverted input signals or an inverted output signal. In a separate embodiment, the library includes the set of general logic functions, each of which represents groups of specific logic functions, the specific logic functions of each group differing by one or more inverted input signals, but does not represent those specific logic functions which differ by an inverted output signal.

In one embodiment, all general logic functions are assigned an equal cost (e.g., "1"). In another embodiment, the general logic functions are assigned a cost which is related to the number of input signals used (e.g., in Table 4 above, general logic function x1 is assigned a cost different from general logic function x2 because x1 includes four input signals and x2 includes three input signals). A third embodiment assigns a cost of $2^i$ to each general logic function, where i is the number of input signals. A fourth embodiment assigns a cost equal to the number of times an input signal is used in a general logic function. A fifth embodiment assigns a cost equal to the total number of input signal terms (a term is a combination of ANDed input signals separated by an OR function) in a general logic function. Other costs and any combination of such costs can also be used. In another embodiment in which the target FPLD includes function generators of more than one size or which includes hard wired functions, as well as table lookup functions, a lower cost is assigned to functions which are preferred in the implementation in order to give preference to the cheaper implementations. The above costs all relate to the number of programmable components required to implement the circuit design. Cost-related delays caused by a specific implementation may also be included, in order to cause the technology mapping algorithm to select a set of library elements which minimize delay as well as the number of programmable components used.

One method of technology mapping proceeds as follows. The step of technology mapping includes dividing the circuit design into logic portions having n (or fewer) input signals and matching the logic portions to general logic functions. This process begins by comparing the logic portion to the library of general logic functions. If there is a match, then information regarding the matched general logic function is assigned to a memory location associated with the logic portion. If there is no match, an invert function pair (first and second invert functions) is assigned to one of the input signals (or the output signal). The LBTMA interprets the addition of the invert function pair by modifying the logic portion to include one of the invert functions as part of the input signal (or output signal) of the logic portion, and treating the second invert function as a logic element which is external to the logic portion. The LBTMA then compares the modified logic portion with the general logic functions. If there is still no match, the process of applying invert function pairs to input signals is repeated (iterated), applying the invert function pairs to different combinations of input signals (and/or output signal) until the modified logic portion matches a general logic function. Using the unique library of the present invention (discussed above), where n inputs are used to address $2^n$ data input signals, a match is assured during this iteration process. The resulting information assigned to the memory location associated with the logic portion includes the matched general logic function and the input signals upon which are added invert functions.

Another method of technology mapping proceeds as follows. In addition to general logic functions of n inputs (where the lookup table contains $2^n$ memory locations or data input signals), the library contains additional general logic functions having more than n input signals. In this embodiment, the circuit design may be divided into logic portions having a number of input signals equal to or less than the number of input signals associated with the additional general logic functions. For example, if the number of input signals of the additional general logic functions equals five, then the circuit design is divided into logic portions having five input signals or less. If a 5-input logic portion matches one of the additional general logic functions, then information regarding the matching additional general logic function is assigned to a memory location associated with the logic portion. When this information is used to program an FPLD, the resulting structure is similar to that shown in FIG. 2c. If the logic portion does not match one of the additional general logic functions, then the logic portion is divided into subportions having fewer input signals.

After all of the logic portions have been mapped such that they are represented by a general logic function plus one or more invert functions, as shown in step 72 the general logic functions selected from the library are merged with any invert functions on the input signals or output signal. The merged logic portions now represent the specific logic functions defined by the original logic portions. The merged logic portions are used to generate truth tables which are used to program the memory locations associated with lookup tables located in the target FPLD to be programmed.

As shown in step 73, placing and routing are then performed, the routing taking into account any pin swapping which was used to identify matching library elements. The step of placing and routing includes the formation of a "bit stream", or sequence of single bit programming instructions, which are used during the programming of the target FPLD. To form the bit stream, the truth tables, which have been generated by adjusting the general logic functions to incorporate associated invert functions, are combined and ordered so that they can be used to configure programmable components of the target FPLD.

Finally, as shown in step 74, this bit stream is used to configure the target FPLD, generating a programmed FPLD which implements the user's circuit.

Figure 8A:
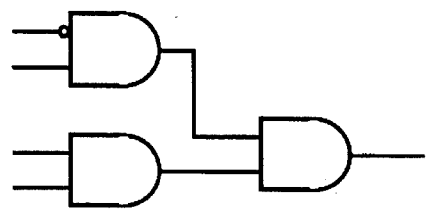
FIGS. 8a–8g illustrate various steps of the method of programming according to the present invention.
Figure 8B:
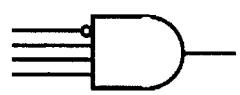
Figure 8D:
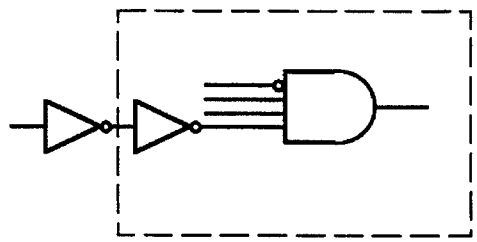
Figure 8E:
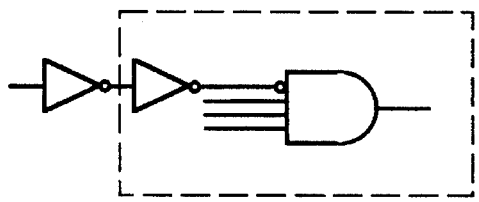
Figure 8F:
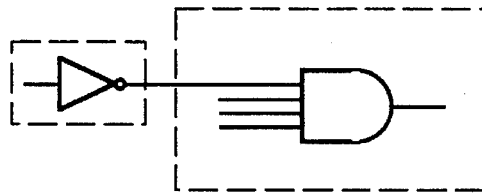
Figure 8C:
Figure 8G:

An example of the method according to the present invention is shown in FIGS. 8a–8g. FIG. 8a represents a subcircuit of a circuit design, drawn at the gate level, which is formed into a logic portion during the technology mapping step 71. FIG. 8b illustrates a logic portion which is recognized by the LBTMA to be equivalent to the logic of FIG. 8a and represents the logic equation !a*b*c*d (that is, a 4-input AND gate with one inverted input signal). FIG. 8c illustrates a portion of the library according to the present invention which represents the 222 general logic functions of the 4-input lookup table library in Table 4. During a first iteration, the logic portion is compared to the library and does not match a general logic function; that is, assuming the element x1 (shown in FIG. 8c) is the general logic function which most closely matches the logic portion, the presence of the inverted input signal on the logic portion prevents a match. Once it is determined that no general logic function matches the logic portion, the iterative process of adding two invert functions to the input signals (and/or output signal) of the logic portion is commenced. For purposes of explanation, assume that the invert function pair is added to the "d" input signal, as shown in FIG. 8d. As indicated by the dotted lines, the LBTMA would interpret the modified logic portion as an invert function and the logic equation !a*b*c*!d. Clearly, when the modified logic portion is recompared to the library, the modified logic portion fails to match element x1 (or any other element). The iterative process of adding invert function pairs is repeated until a pair of invert functions are applied to the "a" input signal, as shown in FIG. 8e. Because the presence of one invert function cancels the inversion of the "a" input signal the logic equation becomes !(!a)*b*c*d, or a*b*c*d, which matches the library element x1 shown in FIG. 8c. As shown in FIG. 8f, the LBTMA then stores in memory (associated with the logic portion) library element x1 and the invert function x222 (applied to the "a" input). As shown in FIG. 8g, after technology mapping is completed for all logic portions, the step 72 (FIG. 7) of merging the information stored for all logic portions is performed, thereby reproducing the logic defined by the logic portion. If the target FPLD is lookup table-based, a truth table is then generated for use in programming the lookup table which implements the logic portion.

If the general logic functions listed in Table 5 were used in the above example, the iterative process of adding invert function pairs would differ in that no invert function pairs would be added to the output signal.

In light of the above description, other embodiments of the present invention will become obvious to those skilled in the art. Such other embodiments are intended to fall within the scope of the present invention.

I claim:

1. A library for use in programming a logic device, said library comprising:

a set of general logic functions for generating an output signal x as a function of n input signals, each of said general logic functions being convertable to a group of specific logic functions which differ from each other by inversion of an input or output signal, and each general logic function differing from another general logic function such that one general logic function can not be made the same as another general logic function only by inversion of one or more input or output signals.

2. A library for use in programming a logic device, said library comprising:

a set of general logic functions for generating an output signal x as a function of n input signals, each of said general logic functions being convertable to a group of specific logic functions by inversion of one or more input or output signals, each general logic function differing from another general logic function such that one general logic function can not be made the same as another general logic function only by inversion of one or more input or output signals.

3. A library as in claim 2 in which each of said general logic functions is further convertable to a set of specific logic functions by permutation of said input signals.

* * * * *